(12) United States Patent
Kim et al.

(10) Patent No.: US 10,868,502 B2
(45) Date of Patent: Dec. 15, 2020

(54) SWITCHED CAPACITOR CIRCUIT TO MAKE AMOUNT OF CHANGE IN REFERENCE VOLTAGE EVEN REGARDLESS OF INPUT LEVEL

(71) Applicant: SAMSUNG ELECTRONICS CO., LTD., Suwon-si (KR)

(72) Inventors: Yong-Woo Kim, Seongnam-si (KR); Sun-Jae Park, Seoul (KR); Eun Seok Shin, Seoul (KR); Seunghoon Lee, Hwasong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/674,875

(22) Filed: Nov. 5, 2019

(65) Prior Publication Data

US 2020/0076381 A1 Mar. 5, 2020

Related U.S. Application Data

(62) Division of application No. 15/978,233, filed on May 14, 2018, now Pat. No. 10,476,449.

(30) Foreign Application Priority Data

Dec. 1, 2017 (KR) .................. 10-2017-0164439

(51) Int. Cl.
*H03F 3/45* (2006.01)
*H03F 3/00* (2006.01)

(52) U.S. Cl.
CPC ......... *H03F 3/005* (2013.01); *H03F 3/45475* (2013.01); *H03F 3/45479* (2013.01); *H03F 2203/45012* (2013.01); *H03F 2203/45156* (2013.01)

(58) Field of Classification Search
CPC ....................................................... H03F 3/45
See application file for complete search history.

(56) References Cited

U.S. PATENT DOCUMENTS

| 5,729,232 A | 3/1998 | Fujimori |
| 5,923,206 A | 7/1999 | Levinson |
| 6,566,934 B1 | 5/2003 | Goren et al. |

(Continued)

FOREIGN PATENT DOCUMENTS

JP 2012-142799 A 7/2012

*Primary Examiner* — Henry Choe
(74) *Attorney, Agent, or Firm* — Volentine, Whitt & Francos, PLLC

(57) ABSTRACT

A switched capacitor circuit includes a first main sampler circuit, a second main sampler circuit, a first replica sampler circuit, and a second replica sampler circuit. The first main sampler circuit samples a first input of a differential input, and generates a first output corresponding to the sampled first input based on a first reference voltage. The second main sampler circuit samples a second input of the differential input, and generates a second output corresponding to the sampled second input based on a second reference voltage. The first replica sampler circuit receives the first input, and holds the received first input based on the second reference voltage. The second replica sampler circuit receives the second input, and holds the received second input based on the first reference voltage.

17 Claims, 22 Drawing Sheets

(56) References Cited

U.S. PATENT DOCUMENTS

| | | | |
|---|---|---|---|
| 7,295,143 B2 * | 11/2007 | Ambo | H03G 1/0094 |
| | | | 330/9 |
| 7,652,528 B2 | 1/2010 | Ballarin | |
| 7,948,412 B2 | 5/2011 | Aiba | |
| 8,223,059 B2 * | 7/2012 | Ono | H03M 1/0607 |
| | | | 341/122 |
| 8,749,425 B1 | 6/2014 | Hu et al. | |
| 8,922,266 B2 | 12/2014 | Ikeda et al. | |
| 9,223,332 B1 | 12/2015 | Himmelbauer et al. | |
| 9,307,175 B2 * | 4/2016 | Van Blerkom | H04N 5/3575 |
| 9,537,498 B2 | 1/2017 | Liu et al. | |
| 9,791,638 B2 | 10/2017 | Schie | |
| 2015/0309517 A1 | 10/2015 | Leibowitz et al. | |

* cited by examiner

SWITCHED CAPACITOR CIRCUIT TO MAKE AMOUNT OF CHANGE IN REFERENCE VOLTAGE EVEN REGARDLESS OF INPUT LEVEL

CROSS-REFERENCE TO RELATED APPLICATIONS

This is a Divisional of U.S. application Ser. No. 15/978,233, filed May 14, 2018, which issued as U.S. Pat. No. 10,476,449 on Nov. 12, 2019, and a claim of priority under 35 U.S.C. § 119 is made to Korean Patent Application No. 10-2017-0164439 filed on Dec. 1, 2017, in the Korean Intellectual Property Office, the disclosure of which is incorporated herein by reference in its entirety.

TECHNICAL FIELD

The present disclosure relates to an electronic device, and more particularly, relates to configurations and operations of a switched capacitor circuit used to process a signal.

DISCUSSION OF THE RELATED ART

In recent years, various kinds of electronic devices are being used. An electronic device provides its own function according to operations of electronic circuits included in the electronic device. Some electronic circuits may process signals transmitted/received outside/inside the electronic device, and thus may generate a signal/data/information suitable to operate the electronic device.

A switched capacitor circuit is an example of electronic circuits used to process a discrete-time signal. The switched capacitor circuit may discretely sample a signal which is continuous in a time domain, and may generate an output corresponding to the sampled result. The switched capacitor circuit may be used for various purposes such as a data sampler, a signal integrator, a voltage converter, a filter, and/or the like.

Meanwhile, in an electronic circuit, signal flow may affect an electrical state (e.g., a voltage, current, and/or the like). For example, when current flows, a level of a voltage for driving the current may temporarily fluctuate. Such fluctuation of the electrical state may affect overall operations of the electronic circuit. Accordingly, in terms of accuracy and stability of an operation of an electronic circuit, accurate control of the operation of the electronic circuit to make an electrical state vary within a predictable range may be an important issue.

SUMMARY

Example embodiments of the present disclosure may provide configurations and operations to make an amount of change in a level of a reference voltage used for an operation of a switched capacitor circuit even, regardless of an input level of a differential input. Some example embodiments may provide configurations and operations capable of supplying charges for providing the reference voltage.

In some example embodiments, a switched capacitor circuit may include a first main sampler circuit, a second main sampler circuit, a first replica sampler circuit, and a second replica sampler circuit. The first main sampler circuit may sample a first input of a differential input, and may generate a first output corresponding to the sampled first input based on a first reference voltage. The second main sampler circuit may sample a second input of the differential input, and may generate a second output corresponding to the sampled second input based on a second reference voltage. The first replica sampler circuit may receive the first input, and may hold the received first input based on the second reference voltage. The second replica sampler circuit may receive the second input, and may hold the received second input based on the first reference voltage.

In some example embodiments, a switched capacitor circuit may include a main sampler circuit, a replica sampler circuit, and an amplifier. The main sampler circuit may include a first capacitive element for storing charges corresponding to one input of a differential input, a first sampling switch element for transferring the one input to the first capacitive element, and a first holding switch element for providing a first reference voltage to the first capacitive element. The replica sampler circuit may include a second capacitive element for storing charges corresponding to the one input, a second sampling switch element for transferring the one input to the second capacitive element, and a second holding switch element for providing the second capacitive element with a second reference voltage which is different from the first reference voltage. The amplifier may generate an output, based on the charges stored in the first capacitive element.

In some example embodiments, a switched capacitor circuit may include a main sampler circuit and a replica sampler circuit. The main sampler circuit may include a first capacitive element for storing charges corresponding to a first input of a differential input, and may generate an output corresponding to the charges stored in the first capacitive element based on a reference voltage. The replica sampler circuit may include a second capacitive element for storing charges corresponding to a second input of the differential input, and may hold the charges stored in the second capacitive element based on the reference voltage. An amount of charges supplied to the main sampler circuit and the replica sampler circuit based on the reference voltage may be maintained to be even regardless of levels of the first and second inputs.

In some example embodiments, a switched capacitor circuit includes a differential amplifier having first and second differential input terminals, a first sampling circuit comprising a first capacitor, a second sampling circuit comprising a second capacitor, a third sampling circuit comprising a third capacitor, and a fourth sampling circuit comprising a fourth capacitor. During a first period of time: (1) the first sampling circuit charges the first capacitor with a first voltage generated between a first differential input signal and a common mode voltage, (2) the second sampling circuit charges the second capacitor with a second voltage generated between the first differential input signal and the common mode voltage, (3) the third sampling circuit charges the third capacitor with a third voltage generated between a second differential input signal and the common mode voltage, and (4) the fourth sampling circuit charges the fourth capacitor with a fourth voltage generated between the second differential input signal and the common mode voltage. During a second period of time that follows the first period of time and does not overlap the first period of time: (5) the fourth sampling circuit charges the fourth capacitor with a fifth voltage generated between a first reference voltage and the common mode voltage, (6) the first sampling circuit charges the first capacitor with a sixth voltage generated between a second reference voltage and the common mode voltage, (7) the second sampling circuit provides a first charge, stored in the second capacitor during the first period of time, to the first differential input terminal of the differential amplifier and provides the first reference voltage to the second capacitor, so as to maintain the first charge within the second capacitor, and (8) the third sampling circuit provides a second charge, stored in the third capacitor during the first period of time, to the second differential input terminal of the differential amplifier and provides the second reference voltage to the third capacitor, so as to maintain the second charge within the third capacitor.

In some example embodiments, as a level of a reference voltage used in an operation of a switched capacitor circuit varies to be predictable, linearity and accuracy of the operation of the switched capacitor circuit may be improved. In some example embodiments, as a configuration to supply charges for the reference voltage is employed, operation speed of the switched capacitor circuit may become faster, and power consumption thereof may be reduced. These example embodiments may be implemented with low cost on a small circuit area.

BRIEF DESCRIPTION OF THE DRAWINGS

The above and other objects and features of the present disclosure will become apparent by describing in detail example embodiments thereof with reference to the accompanying drawings.

DETAILED DESCRIPTION OF EXAMPLE EMBODIMENTS

Below, some example embodiments will be described in detail and clearly with reference to accompanying drawings such that those skilled in the art easily can implement the example embodiments.

Figure 1:
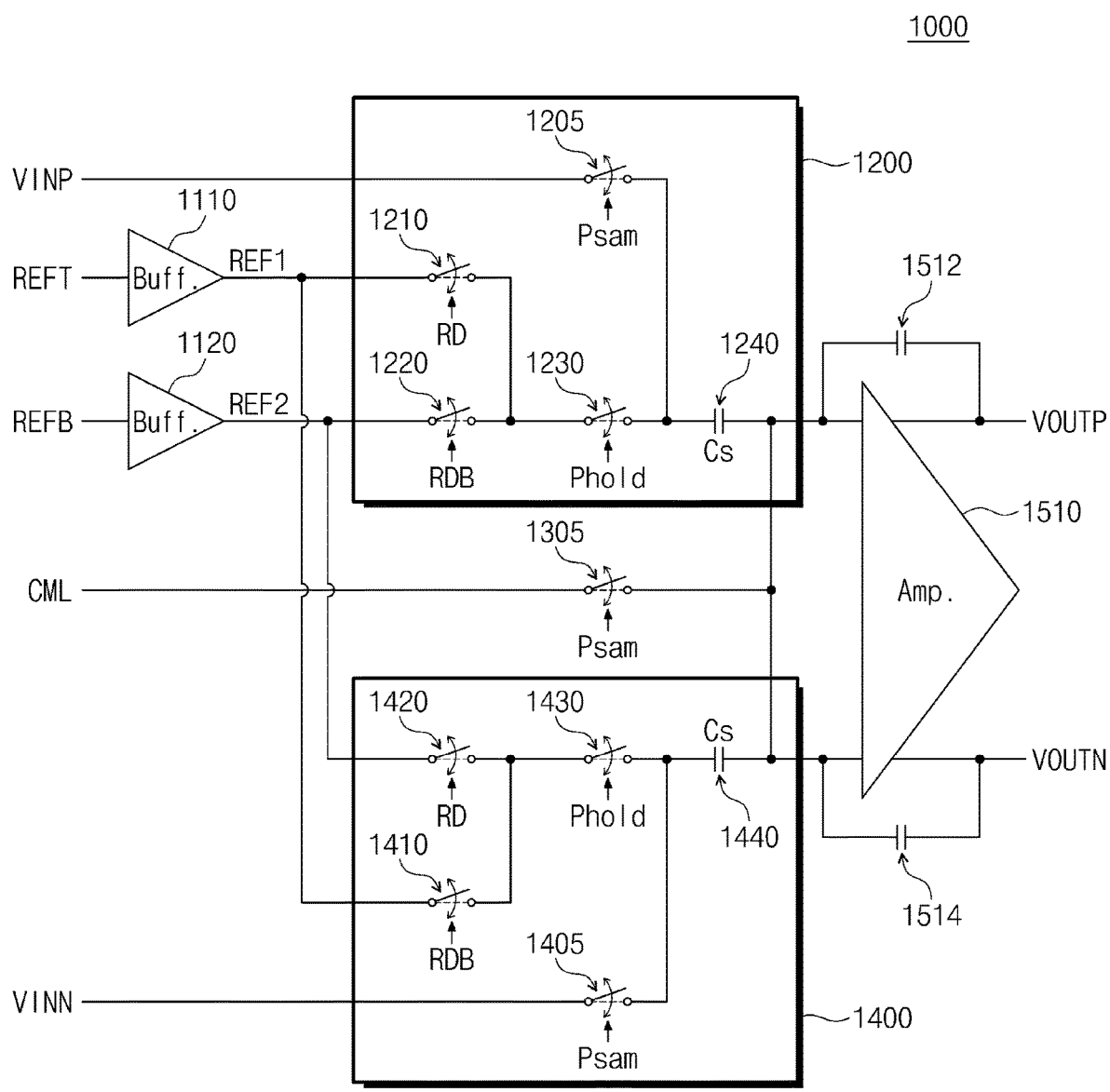
FIG. 1 is a circuit diagram illustrating an example configuration of a switched capacitor circuit according to some example embodiments.

FIG. 1 is a circuit diagram illustrating an example configuration of a switched capacitor circuit 1000 according to some example embodiments.

The switched capacitor circuit 1000 may include reference buffers 1110 and 1120, main sampler circuits 1200 and 1400, a switch element 1305, an amplifier 1510, and capacitive elements 1512 and 1514.

The switched capacitor circuit 1000 may be an electronic circuit including, at least, a capacitive element and a switch element. For example, the capacitive element may include an element for storing charges (e.g., a capacitor), and the switch element may include an element for passing or blocking an electrical signal (e.g., a transistor).

For example, the main sampler circuit 1200 of the switched capacitor circuit 1000 may include switch elements 1205, 1210, 1220, and 1230 and a capacitive element 1240, and the main sampler circuit 1400 of the switched capacitor circuit 1000 may include switch elements 1405, 1410, 1420, and 1430 and a capacitive element 1440. Each of the capacitive elements 1240 and 1440 may have a capacitance value Cs.

The switched capacitor circuit 1000 may be employed for signal processing. For example, the switched capacitor circuit 1000 may receive a differential input (e.g., inputs VINP and VINN). For example, the switched capacitor circuit 1000 may process the inputs VINP and VINN to generate a differential output (e.g., outputs VOUTP and VOUTN).

FIG. 1 illustrates an example where the switched capacitor circuit 1000 is a fully differential circuit, but this is provided to facilitate better understanding and is not intended to limit the present disclosure. In some example embodiments, the switched capacitor circuit 1000 may be changed or modified to generate an output of a single-ended type.

For example, the switched capacitor circuit 1000 may be used for various purposes such as a data sampler, a signal integrator, a voltage converter, a filter, and/or the like. For example, the switched capacitor circuit 1000 may be employed in various functional circuits such as a modulator (e.g., a delta-sigma modulator and/or the like), an analog-to-digital converter (ADC), a digital-to-analog converter, and/or the like, and may be included in various devices such as a modulator/demodulator (MODEM), a sensor (e.g., an image sensor, a biosensor, a touch sensor, and/or the like), an audio processor, a power management integrated circuit (PMIC), and/or the like.

The switched capacitor circuit 1000 may receive main reference voltages REFT and REFB and a common mode voltage CML. For example, the main reference voltages REFT and REFB and the common mode voltage CML may be received from a voltage source such as a bandgap reference circuit, a PMIC, a voltage regulator, and/or the like. The inputs VINP and VINN, the main reference voltages REFT and REFB, and the common mode voltage CML will be further described with reference to FIG. 2.

The reference buffer 1110 may buffer the main reference voltage REFT to output a buffered reference voltage. The reference buffer 1120 may buffer the main reference voltage REFB to output a buffered reference voltage. In some example embodiments, the buffered reference voltages output from the reference buffers 1110 and 1120 may be provided as reference voltages REF1 and REF2. The reference voltage REF1 may be different from the reference voltage REF2. The reference voltages REF1 and REF2 will be further described with reference to FIGS. 7 and 8.

The sampling switch element 1205 may transfer the input VINP of the differential input to the capacitive element 1240 in response to a sampling signal Psam. Accordingly, the capacitive element 1240 may store charges corresponding to the input VINP. As a result, the main sampler circuit 1200 may sample the input VINP in response to the sampling signal Psam.

The selection switch element 1210 may provide the reference voltage REF1 to the capacitive element 1240 in response to a selection signal RD, and the selection switch element 1220 may provide the reference voltage REF2 to the capacitive element 1240 in response to a selection signal RDB. The selection signal RD may be complementary to the selection signal RDB. Accordingly, the main sampler circuit 1200 may selectively provide the reference voltage REF1 or the reference voltage REF2 to the capacitive element 1240 in response to the selection signals RD and RDB.

The main sampler circuit 1200 may receive one selected from the reference voltages REF1 and REF2 in response to a holding signal Phold. The holding switch element 1230 may provide the capacitive element 1240 with one selected from the reference voltages REF1 and REF2, in response to the holding signal Phold. The holding signal Phold may be received after the capacitive element 1240 stores the charges in response to the sampling signal Psam. The holding signal Phold may be complementary to the sampling signal Psam.

For example, the signals Psam, Phold, RD, and RDB may be received from a separate clock generating circuit or a separate control circuit. Each of the signals Psam, Phold, RD, and RDB may have a level or a value to connect or disconnect a respective switch element. The signals Psam, Phold, RD, and RDB will be further described with reference to FIG. 3.

When the holding signal Phold is received, the main sampler circuit 1200 may generate an output corresponding to the charges stored in the capacitive element 1240, based on one selected from the reference voltages REF1 and REF2. As a result, the main sampler circuit 1200 may generate an output corresponding to the sampled input VINP, based on the selected reference voltage.

The sampling switch element 1405 may transfer the input VINN of the differential input to the capacitive element 1440 in response to the sampling signal Psam. Accordingly, the capacitive element 1440 may store charges corresponding to the input VINN. As a result, the main sampler circuit 1400 may sample the input VINN in response to the sampling signal Psam.

The selection switch element 1410 may provide the reference voltage REF1 to the capacitive element 1440 in response to a selection signal RDB, and the selection switch element 1420 may provide the reference voltage REF2 to the capacitive element 1440 in response to the selection signal RD. The main sampler circuit 1400 may selectively provide the reference voltage REF1 or the reference voltage REF2 to the capacitive element 1440 in response to the selection signals RDB and RD.

According to the selection signals RD and RDB, a reference voltage, which is provided to the main sampler circuit 1200, from among the reference voltages REF1 and REF2 may be different from a reference voltage, which is provided to the main sampler circuit 1400, from among the reference voltages REF1 and REF2. For example, when the main sampler circuit 1200 receives the reference voltage REF1 in response to the selection signal RD, the main sampler circuit 1400 may receive the reference voltage REF2 in response to the selection signal RD. On the other hand, when the main sampler circuit 1200 receives the reference voltage REF2 in response to the selection signal RDB, the main sampler circuit 1400 may receive the reference voltage REF1 in response to the selection signal RDB.

For example, which selection signal is to be received among the selection signals RD and RDB may be determined according to an operation policy or an operation status of a function circuit or device which includes the switched capacitor circuit 1000. For example, a separate control circuit may provide the switched capacitor circuit 1000 with a selection signal which is determined according to an operation policy or an operation status of a function circuit or device including the switched capacitor circuit 1000.

The main sampler circuit 1400 may receive one selected from the reference voltages REF1 and REF2, in response to the holding signal Phold. The holding switch element 1430 may provide the capacitive element 1440 with one selected from the reference voltages REF1 and REF2, in response to the holding signal Phold.

When the holding signal Phold is received, the main sampler circuit 1400 may generate an output corresponding to the charges stored in the capacitive element 1440, based on one selected from the reference voltages REF1 and REF2. As a result, the main sampler circuit 1400 may generate an output corresponding to the sampled input VINN, based on the selected reference voltage.

The switch element 1305 may provide the common mode voltage CML to the main sampler circuits 1200 and 1400 in response to the sampling signal Psam. The common mode voltage CML may be provided to the capacitive elements 1240 and 1440. Voltages provided to the capacitive elements 1240 and 1440 will be further described with reference to FIGS. 4 to 6.

The main sampler circuits 1200 and 1400 may generate outputs, based on the charges stored in the capacitive elements 1240 and 1440. The amplifier 1510 may generate the differential output (e.g., the outputs VOUTP and VOUTN), based on the outputs of the main sampler circuits 1200 and 1400. That is, the outputs VOUTP and VOUTN may be generated based on the charges stored in the capacitive elements 1240 and 1440.

The capacitive elements 1512 and 1514 may be connected between input terminals and output terminals of the amplifier 1510. The capacitive elements 1512 and 1514 may affect an amplification ratio of the amplifier 1510. The amplification ratio of the amplifier 1510 may correspond to a level ratio between an input of the amplifier 1510 and an output of the amplifier 1510. For example, a capacitance ratio of the capacitive elements 1240 and 1512 and a capacitance ratio of the capacitive elements 1440 and 1514 may determine the amplification ratio of the amplifier 1510.

Figure 2:
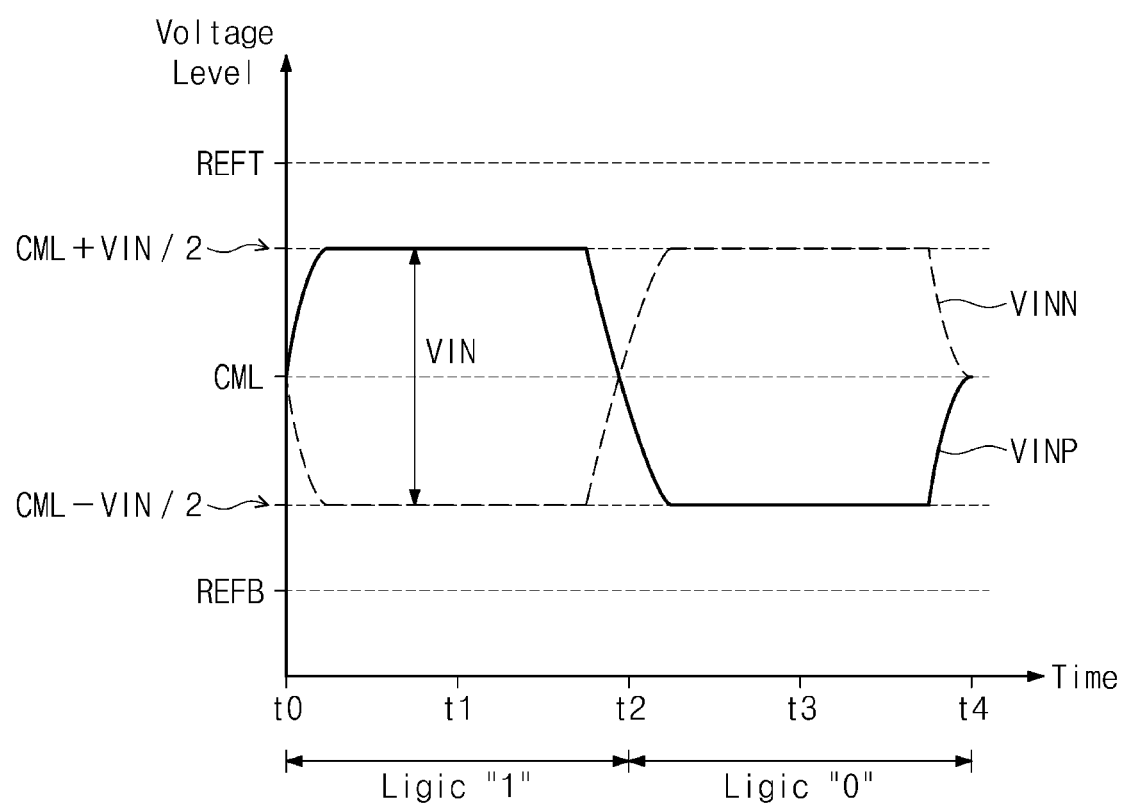
FIG. 2 is a graph for describing an example differential input and example reference voltages of FIG. 1.

FIG. 2 is a graph for describing the example differential input VINP and VINN and the example reference voltages REFT and REFB of FIG. 1.

Levels of the inputs VINP and VINN may be symmetrical with respect to the common mode voltage CML. The common mode voltage CML may provide a reference of the differential input VINP and VINN. A maximum difference between the levels of the inputs VINP and VINN may be "VIN". Accordingly, the levels of the inputs VINP and VINN may vary between "CML+VIN/2" and "CML−VIN/2".

For example, a level of the main reference voltage REFT may be higher than "CML+VIN/2", and a level of the main reference voltage REFB may be lower than "CML−VIN/2". The levels of the main reference voltages REFT and REFB may provide levels that the reference voltages REF1 and REF2 are intended to have. The reference voltages REF1 and REF2 may be used to generate an output, based on the charges stored in the capacitive elements 1240 and 1440.

For example, when the level of the input VINP is higher than the level of the input VINN (e.g., between time t0 and t2), the differential input VINP and VINN may be intended to indicate a data value of logic "1". On the other hand, when the level of the input VINP is lower than the level of the input VINN (e.g., between time t2 and t4), the differential input VINP and VINN may be intended to indicate a data value of logic "0". However, this example is provided to facilitate better understanding, and a data value intended by the differential input VINP and VINN may be changed or modified to be different from this example.

Figure 3:
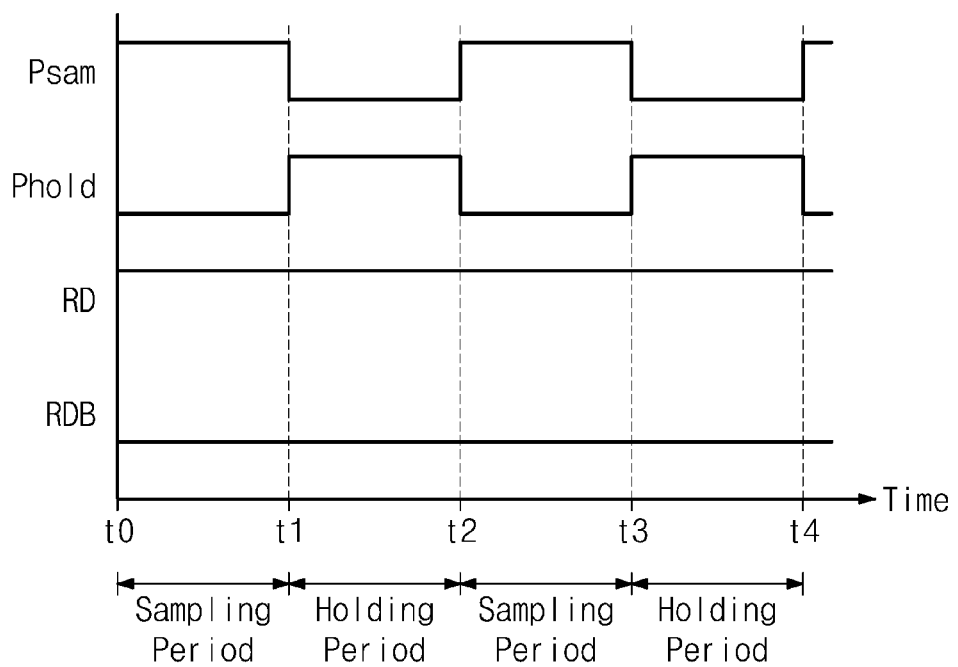
FIG. 3 is a graph for describing example signals for controlling switches of FIG. 1.

FIG. 3 is a graph for describing the example signals Psam, Phold, RD, and RDB for controlling switches of FIG. 1.

Each of the signals Psam and Phold may have a level or a value for connecting or disconnecting a respective switch element 1205, 1230, 1305, 1405, and 1430. The sampling signal Psam may be complementary to the holding signal Phold.

For example, in sampling periods (e.g., between time t0 and t1, and between time t2 and t3), the sampling signal Psam may have a level of logic "1", and the holding signal Phold may have a level of logic "0". For example, in holding periods (e.g., between time t1 and t2, and between time t3 and t4), the sampling signal Psam may have a level of logic "0", and the holding signal Phold may have a level of logic "1".

Referring to FIG. 1 together, in the sampling periods, the switch elements 1205, 1305, and 1405 may be connected (e.g., closed or turned on to make current flow) in response to the sampling signal Psam, and the switch elements 1230 and 1430 may be disconnected (e.g., opened or turned off to block current flow) in response to the holding signal Phold. Accordingly, the capacitive elements 1240 and 1440 may store charges corresponding to the inputs VINP and VINN, based on the common mode voltage CML.

Meanwhile, in the holding periods, the switch elements 1205, 1305, and 1405 may be disconnected in response to the sampling signal Psam, and the switch elements 1230 and 1430 may be connected in response to the holding signal Phold. Accordingly, the charges stored in the capacitive elements 1240 and 1440 may be output to the amplifier 1510 and the capacitive elements 1512 and 1514, based on the reference voltages REF1 and REF2. In the holding periods, as the switch element 1305 is disconnected, the input terminals of the amplifier 1510 may have the same level due to a characteristic of the amplifier 1510 (e.g., which is so called as a "virtual ground" state).

Returning to FIG. 3, for example, the level of logic "1" of the sampling signal Psam and the holding signal Phold may be understood as the sampling signal Psam and the holding signal Phold being received. On the other hand, the level of logic "0" of the sampling signal Psam and the holding signal Phold may be understood as the sampling signal Psam and the holding signal Phold being not received. In this regard, it may be understood that the sampling signal Psam and the holding signal Phold are received continuously and alternately.

Each of the signals RD and RDB may have a level or a value for connecting or disconnecting a respective switch element 1210, 1220, 1410, and 1420. The selection signal RD may be complementary to the selection signal RDB. For example, the selection signal RD may have a level of logic "1", and the selection signal RDB may have a level of logic "0". In this example, referring to FIG. 1, the main sampler circuit 1200 may receive the reference voltage REF1, and the main sampler circuit 1400 may receive the reference voltage REF2.

Below, it will be described that the main sampler circuit 1200 receives the reference voltage REF1 and the main sampler circuit 1400 receives the reference voltage REF2 in response to the selection signal RD. However, this is provided to facilitate better understanding, and is not intended to limit the present disclosure. As described above, reference voltages to be provided to the main sampler circuits 1200 and 1400 may be interchanged, according to an operation policy or an operation status of a function circuit or device which includes the switched capacitor circuit 1000.

Figure 4:
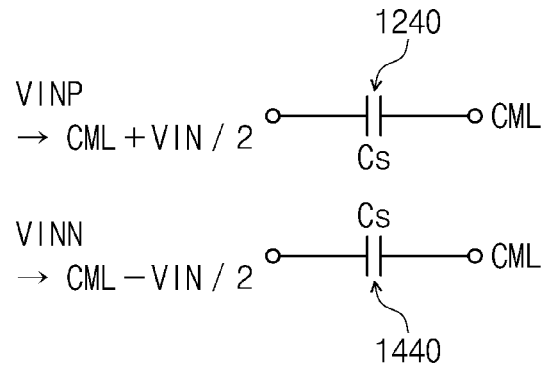
FIGS. 4 to 6 are conceptual diagrams for describing example voltages provided to capacitive elements of FIG. 1.
Figure 5:
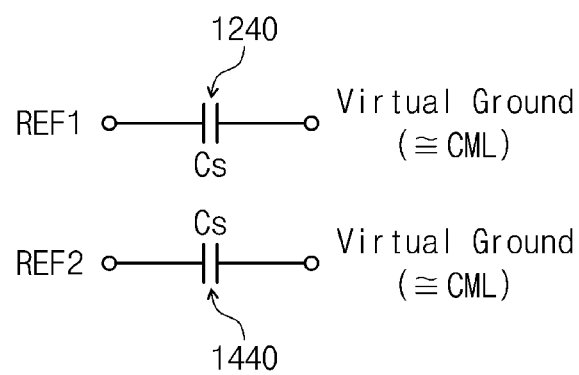
Figure 6:
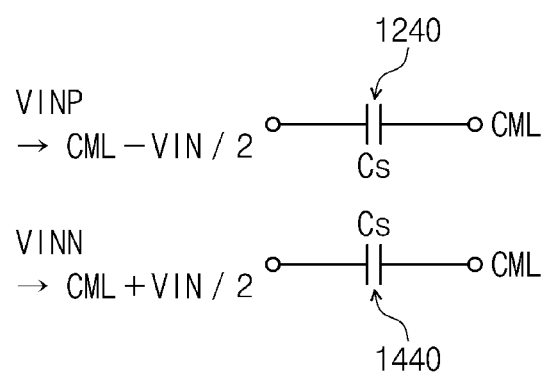

FIGS. 4 to 6 are conceptual diagrams for describing example voltages provided to the capacitive elements 1240 and 1440 of FIG. 1.

FIG. 4 illustrates voltages provided to the capacitive elements 1240 and 1440 in the sampling period between time t0 and t1. Referring to FIGS. 1 to 3 together, in the sampling period between time t0 and t1, the input VINP of a level of "CML+VIN/2" and the common mode voltage CML may be provided to opposite ends of the capacitive element 1240. In addition, the input VINN of a level of "CML−VIN/2" and the common mode voltage CML may be provided to opposite ends of the capacitive element 1440. Accordingly, the capacitive elements 1240 and 1440 may store charges in response to the levels of "CML+VIN/2" and "CML−VIN/2".

FIG. 5 illustrates voltages provided to the capacitive elements 1240 and 1440 in the holding periods between time t1 and t2 and between time t3 and t4. Referring to FIGS. 1 to 3 together, in the holding periods, the reference voltages REF1 and REF2 may be respectively provided to first ends of the capacitive elements 1240 and 1440. Accordingly, the charges stored in the capacitive elements 1240 and 1440 may be output to the amplifier 1510 and the capacitive elements 1512 and 1514, based on the reference voltages REF1 and REF2. Meanwhile, as the input terminals of the amplifier 1510 are at the virtual ground state, levels of second terminals of the capacitive elements 1240 and 1440 may be maintained at a level of the common mode voltage CML approximately.

FIG. 6 illustrates voltages provided to the capacitive elements 1240 and 1440 in the sampling period between the time t2 and the time t3. Referring to FIGS. 1 to 3 together, in the sampling period between the time t2 and the time t3, the input VINP of a level of "CML−VIN/2" and the common mode voltage CML may be provided to opposite ends of the capacitive element 1240. In addition, the input VINN of a level of "CML+VIN/2" and the common mode voltage CML may be provided to opposite ends of the capacitive element 1440. Accordingly, the capacitive elements 1240 and 1440 may store charges in response to the levels of "CML−VIN/2" and "CML+VIN/2".

Figure 7:
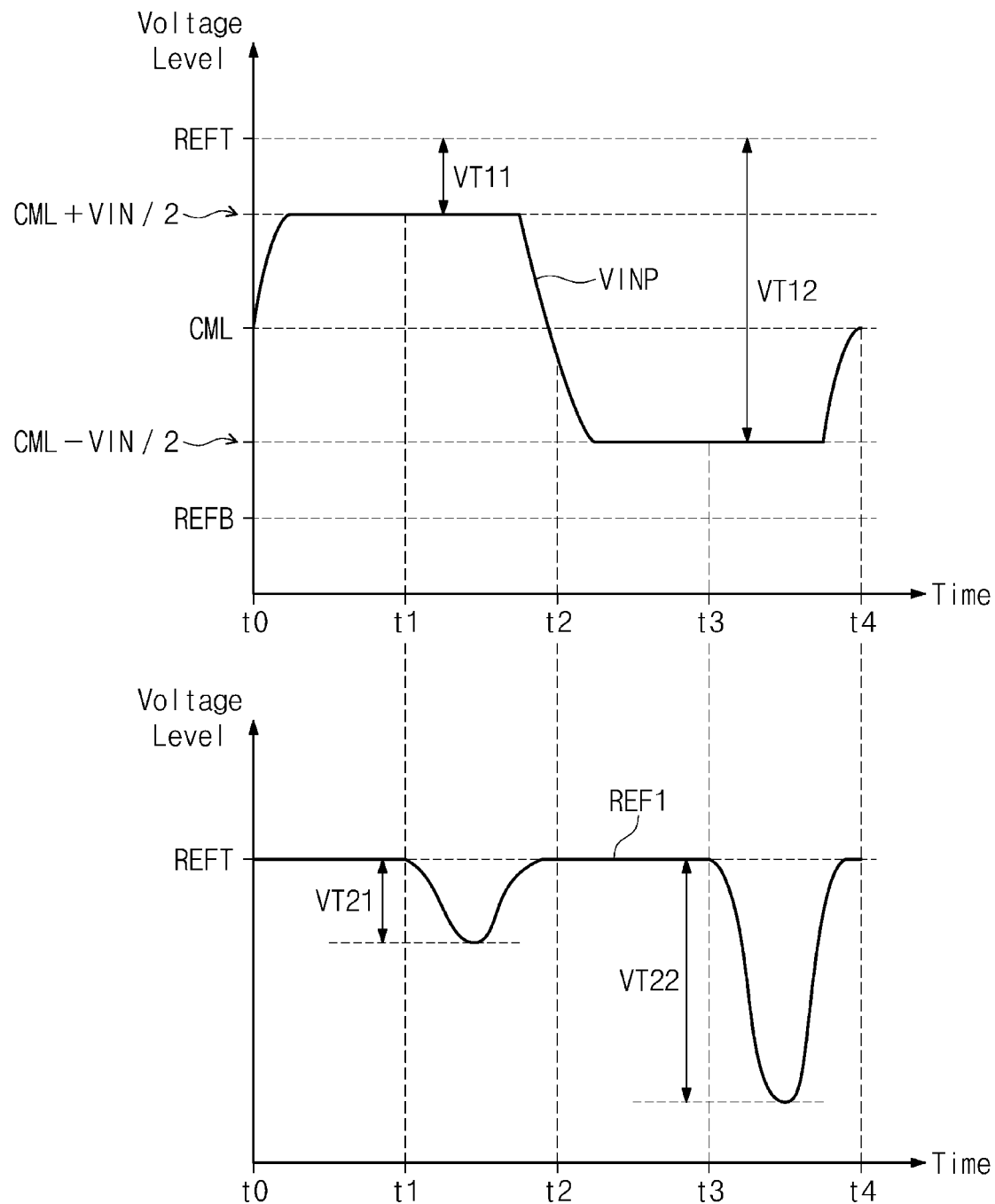
FIGS. 7 and 8 are graphs for describing levels of reference voltages varying with levels of inputs with regard to a switched capacitor circuit of FIG. 1.

FIG. 7 illustrates graphs for describing a level of the reference voltage REF1 varying with a level of the input VINP with regard to the switched capacitor circuit 1000 of FIG. 1.

For example, as the reference voltage REF1 is provided to the capacitive element 1240 in the holding period between time t1 and t2 after the input VINP of the level of "CML+VIN/2" is provided to the capacitive element 1240 in the sampling period between time t0 and t1, the capacitive element 1240 may require additional charges as much as an amount of charges "Cs×VT11" corresponding to a voltage difference "VT11 (=REFT−(CML+VIN/2))". The additional charges may be supplied based on the reference voltage REF1.

In the sampling period between time t0 and t1, a level of the reference voltage REF1 may be maintained at a level of the main reference voltage REFT. However, as the capacitive element 1240 requires the additional charges, the level of the reference voltage REF1 may change as much as a variation amount VT21 from a level of the main reference voltage REFT and then may be restored to the level of the main reference voltage REFT, in the holding period between time t1 and t2.

Similarly, as the reference voltage REF1 is provided to the capacitive element 1240 in the holding period between time t3 and t4 after the input VINP of the level of "CML−VIN/2" is provided to the capacitive element 1240 in the sampling period between time t2 and t3, the capacitive element 1240 may require additional charges as much as an amount of charges "Cs×VT12" corresponding to a voltage difference "VT12 (=REFT−(CML−VIN/2))". Accordingly, after the level of the reference voltage REF1 is maintained at the level of the main reference voltage REFT in the sampling period between time t2 and t3, the level of the reference voltage REF1 may change as much as a variation amount VT22 from the level of the main reference voltage REFT and then may be restored to the level of the main reference voltage REFT, in the holding period between time t3 and t4.

Figure 8:
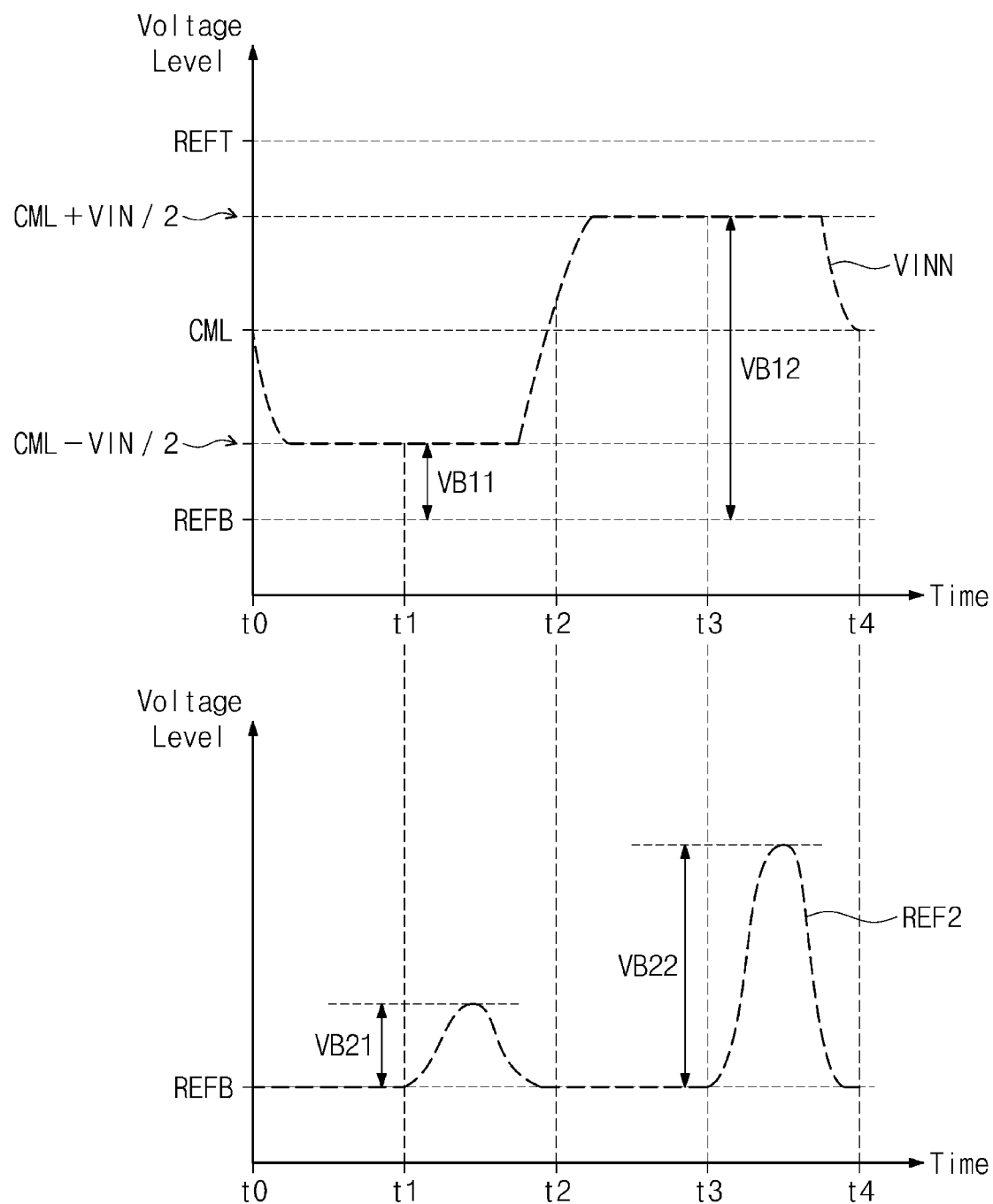

FIG. 8 illustrates graphs for describing a level of the reference voltage REF2 varying with a level of the input VINN with regard to the switched capacitor circuit 1000 of FIG. 1.

For example, as the reference voltage REF2 is provided to the capacitive element 1440 in the holding period between time t1 and t2 after the input VINN of the level of "CML−VIN/2" is provided to the capacitive element 1440 in the sampling period between time t0 and t1, the capacitive element 1440 may require additional charges as much as an amount of charges "Cs×VB11" corresponding to a voltage difference "VB11 (=REFB−(CML−VIN/2))". The additional charges may be supplied based on the reference voltage REF2.

In the sampling period between time t0 and t1, a level of the reference voltage REF2 may be maintained at a level of the main reference voltage REFB. However, as the capacitive element 1440 requires the additional charges, the level of the reference voltage REF2 may change as much as a variation amount VB21 from the level of the main reference voltage REFB and then may be restored to the level of the main reference voltage REFB, in the holding period between time t1 and t2.

Similarly, as the reference voltage REF2 is provided to the capacitive element 1440 in the holding period between time t3 and t4 after the input VINN of the level of "CML+VIN/2" is provided to the capacitive element 1440 in the sampling period between time t2 and t3, the capacitive element 1440 may require additional charges as much as an amount of charges "Cs×VB12" corresponding to a voltage difference "VB12 (=REFB−(CML+VIN/2))". Accordingly, after the level of the reference voltage REF2 is maintained at the level of the main reference voltage REFB in the sampling period between time t2 and t3, the level of the reference voltage REF2 may change as much as a variation amount VB22 from the level of the main reference voltage REFB and then may be restored to the level of the main reference voltage REFB, in the holding period between time t3 and t4.

Referring to FIGS. 7 and 8, it may be understood that the reference voltages REF1 and REF2 vary with the inputs VINP and VINN respectively. For example, with regard to the reference voltage REF1, referring to FIG. 7, the variation amount VT21 in the holding period between time t1 and t2 may be different from the variation amount VT22 in the holding period between time t3 and t4. In addition, with regard to the reference voltage REF2, referring to FIG. 8, the variation amount VB21 in the holding period between time t1 and t2 may be different from the variation amount VB22 in the holding period between time t3 and t4.

That is, it may be understood that the amounts of change in the levels of the reference voltages REF1 and REF2 vary depending on the levels of the inputs VINP and VINN (e.g., depending on a data value intended by the differential input VINP and VINN). In this case, the amounts of change in the levels of the reference voltages REF1 and REF2 may not be accurately predicted, and linearity of an operation of the switched capacitor circuit 1000 may be degraded. Accordingly, it may be difficult to accurately control the operation of the switched capacitor circuit 1000.

Figure 9:
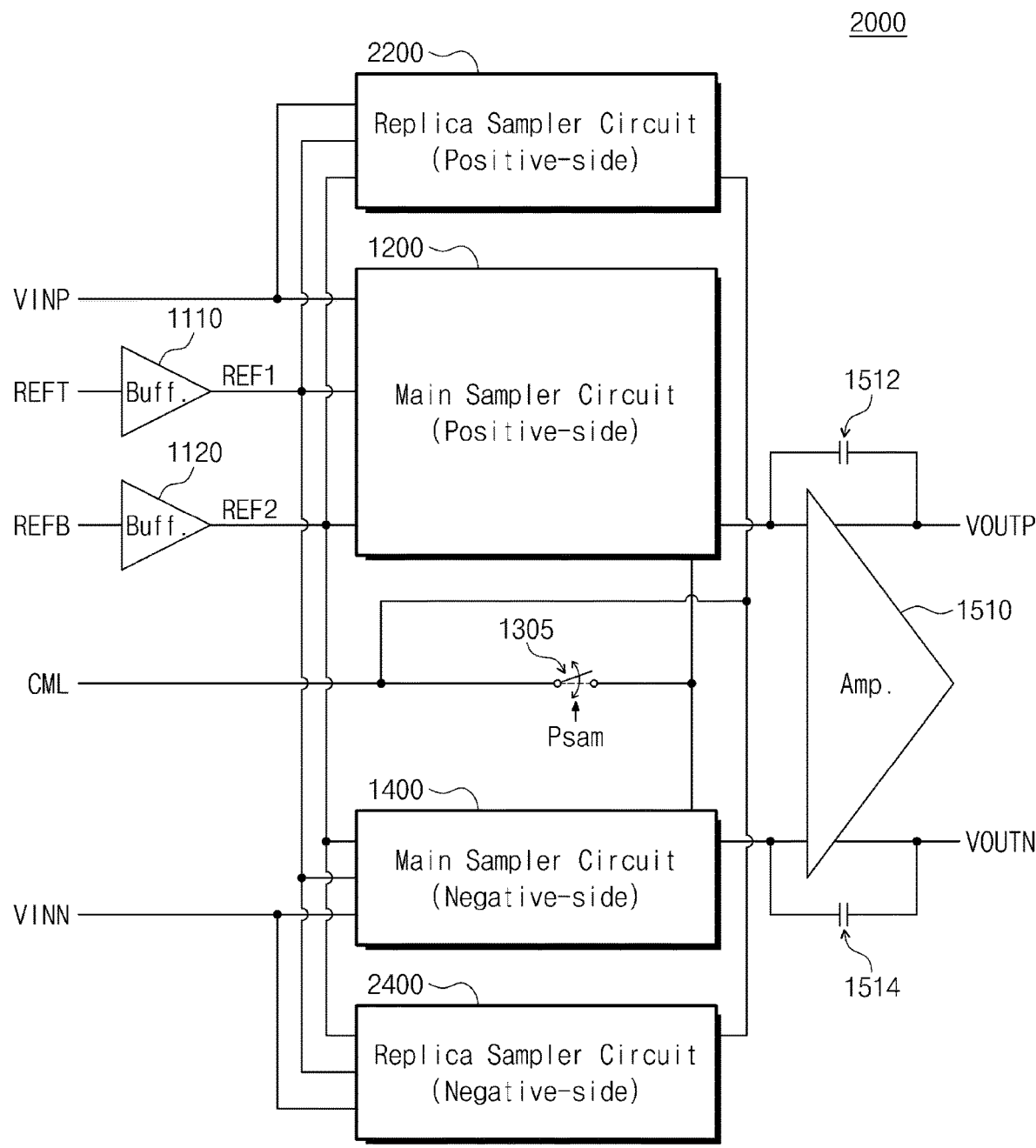
FIG. 9 is a block diagram illustrating an example configuration of a switched capacitor circuit according to some example embodiments.

FIG. 9 is a block diagram illustrating an example configuration of a switched capacitor circuit 2000 according to some example embodiments.

The switched capacitor circuit 2000 may include the reference buffers 1110 and 1120, the main sampler circuits 1200 and 1400, replica sampler circuits 2200 and 2400, the switch element 1305, the amplifier 1510, and the capacitive elements 1512 and 1514. The switched capacitor circuit 2000 may be employed for a purpose or function which is the same as or similar to that of the switched capacitor circuit 1000.

The reference buffers 1110 and 1120, the main sampler circuits 1200 and 1400, the switch element 1305, the amplifier 1510, and the capacitive elements 1512 and 1514 may be configured and may operate to be the same as or similar to those described with reference to FIGS. 1 to 8. For brevity, redundant descriptions associated with these components will be omitted below.

The replica sampler circuits 2200 and 2400 may be provided by replicating configurations of the main sampler circuits 1200 and 1400. However, as will be described with reference to FIGS. 10 and 11, some configurations and operations of the replica sampler circuits 2200 and 2400 may be somewhat different from those of the main sampler circuits 1200 and 1400.

Figure 10:
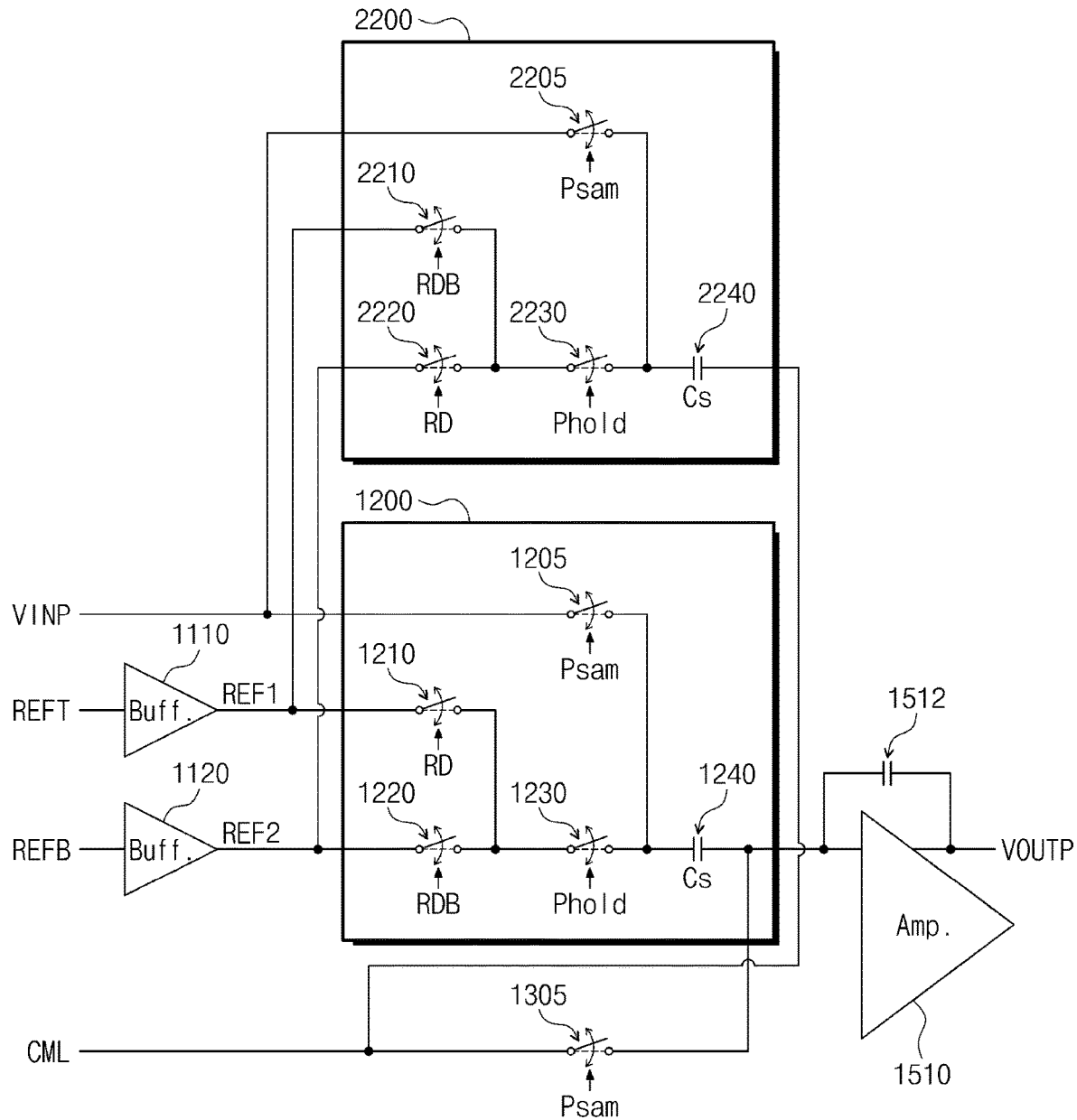
FIGS. 10 and 11 are circuit diagrams illustrating an example configuration of a switched capacitor circuit of FIG. 9.

FIG. 10 is a circuit diagram illustrating an example configuration of the switched capacitor circuit 2000 of FIG. 9. For example, FIG. 10 illustrates a configuration associated with the positive-side input VINP of the differential input VINP and VINN.

The replica sampler circuit 2200 of the switched capacitor circuit 2000 may include switch elements 2205, 2210, 2220, and 2230 and a capacitive element 2240. The capacitive element 2240 may have a capacitance value Cs. The capacitive element 2240 may receive the common mode voltage CML.

The replica sampler circuit 2200 may receive the input VINP in response to the sampling signal Psam. The sampling switch element 2205 may transfer the input VINP to the capacitive element 2240 in response to the sampling signal Psam. Accordingly, the capacitive element 2240 may store charges corresponding to the input VINP.

The selection switch element 2210 may provide the reference voltage REF1 to the capacitive element 2240 in response to the selection signal RDB, and the selection switch element 2220 may provide the reference voltage REF2 to the capacitive element 2240 in response to the selection signal RD. The replica sampler circuit 2200 may selectively provide the reference voltage REF1 or the reference voltage REF2 to the capacitive element 2240 in response to the complementary selection signals RDB and RD.

The replica sampler circuit 2200 may receive one selected from the reference voltages REF1 and REF2 in response to the holding signal Phold. The holding switch element 2230 may provide the capacitive element 2240 with one selected from the reference voltages REF1 and REF2 in response to the holding signal Phold.

When the holding signal Phold is received, the replica sampler circuit 2200 may hold the charges stored in the capacitive element 2240, based on one selected from the reference voltages REF1 and REF2. It may be understood that the replica sampler circuit 2200 holds the received input VINP, based on the selected reference voltage. Herein, holding the charges or the input VINP may mean storing at least a portion of charges, which are supplied based on the input VINP, in the capacitive element 2240.

The main sampler circuit 1200 and the replica sampler circuit 2200 may share the input VINP. Connection among the switch elements 2205, 2210, 2220, and 2230 and the capacitive element 2240 may be the same as connection among the switch elements 1205, 1210, 1220, and 1230 and the capacitive element 1240. It may look as if the replica sampler circuit 2200 is provided by replicating the configuration of the main sampler circuit 1200.

However, when the main sampler circuit 1200 receives the reference voltage REF1 in response to the selection signal RD, the replica sampler circuit 2200 may receive the reference voltage REF2 in response to the selection signal RD. On the other hand, when the main sampler circuit 1200 receives the reference voltage REF2 in response to the selection signal RDB, the replica sampler circuit 2200 may receive the reference voltage REF1 in response to the selection signal RDB.

According to the selection signals RD and RDB, a reference voltage, which is provided to the main sampler circuit 1200, from among the reference voltages REF1 and REF2 may be different from a reference voltage, which is provided to the replica sampler circuit 2200, from among the reference voltages REF1 and REF2. Accordingly, a reference voltage received in the main sampler circuit 1200 in response to the holding signal Phold may be different from a reference voltage received in the replica sampler circuit 2200 in response to the holding signal Phold.

Meanwhile, the replica sampler circuit 2200 may not be directly connected with the amplifier 1510. The amplifier 1510 may use the charges stored in the capacitive elements 1240 and 1440 to generate the outputs VOUTP and VOUTN. However, the amplifier 1510 may not use an output from the replica sampler circuit 2200 (e.g., may not use the charges stored in the capacitive element 2240).

Figure 11:
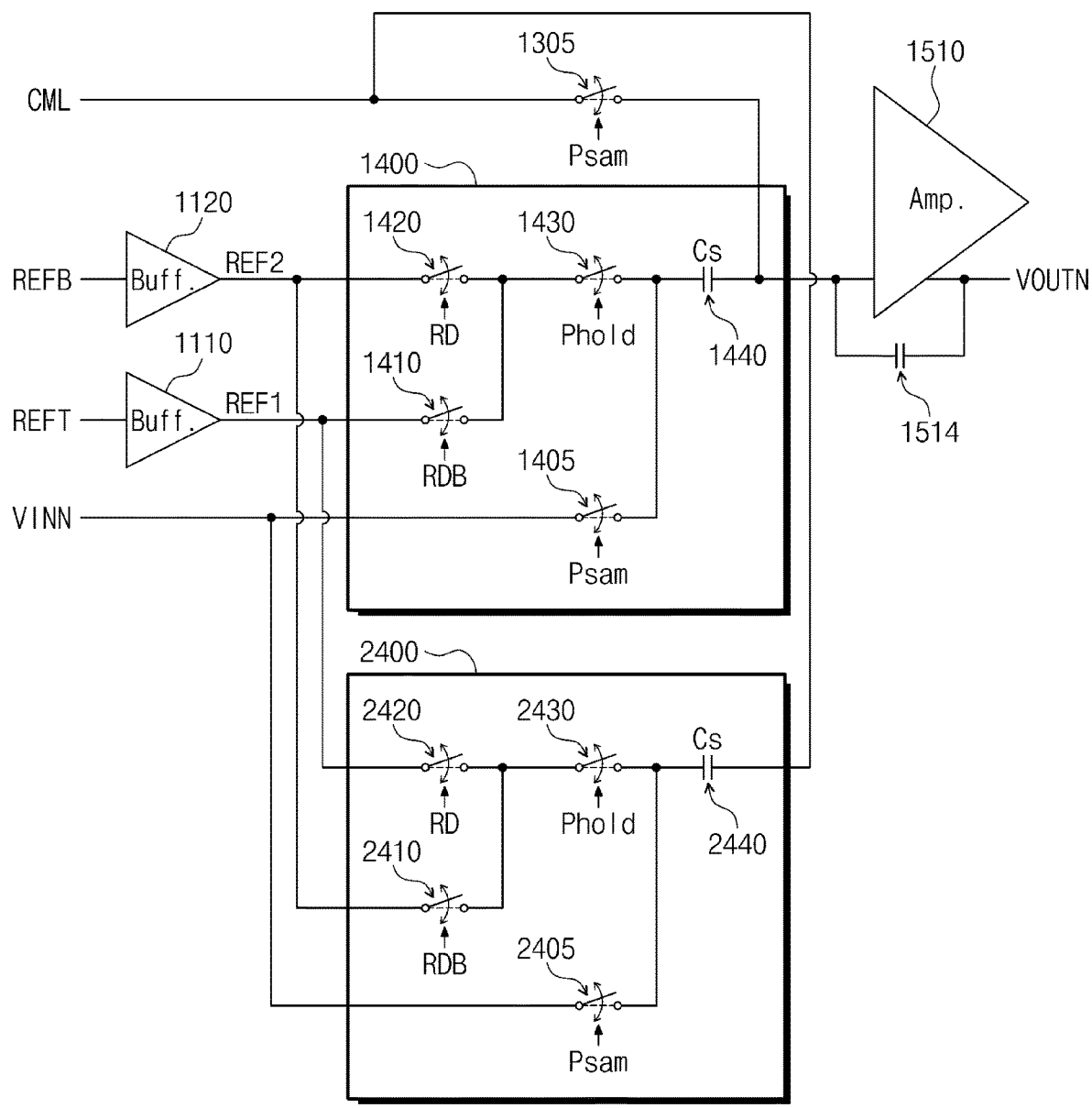

FIG. 11 is a circuit diagram illustrating an example configuration of the switched capacitor circuit 2000 of FIG. 9. For example, FIG. 11 illustrates a configuration associated with the negative-side input VINN of the differential input VINP and VINN.

The replica sampler circuit 2400 of the switched capacitor circuit 2000 may include switch elements 2405, 2410, 2420, and 2430 and a capacitive element 2440. The capacitive element 2440 may have a capacitance value Cs. The capacitive element 2440 may receive the common mode voltage CML.

The replica sampler circuit 2400 may receive the input VINN in response to the sampling signal Psam. The sampling switch element 2405 may transfer the input VINN to the capacitive element 2440 in response to the sampling signal Psam. Accordingly, the capacitive element 2440 may store charges corresponding to the input VINN.

The selection switch element 2420 may provide the reference voltage REF1 to the capacitive element 2440 in response to a selection signal RD, and the selection switch element 2410 may provide the reference voltage REF2 to the capacitive element 2440 in response to the selection signal RDB. The replica sampler circuit 2400 may selectively provide the reference voltage REF1 or the reference voltage REF2 to the capacitive element 2440 in response to the complementary selection signals RD and RDB.

The replica sampler circuit 2400 may receive one selected from the reference voltages REF1 and REF2 in response to the holding signal Phold. The holding switch element 2430 may provide the capacitive element 2440 with one selected from the reference voltages REF1 and REF2 in response to the holding signal Phold. When the holding signal Phold is received, the replica sampler circuit 2400 may hold the charges stored in the capacitive element 2440, based on one selected from the reference voltages REF1 and REF2. It may be understood that the replica sampler circuit 2400 holds the received input VINN, based on the selected reference voltage.

The main sampler circuit 1400 and the replica sampler circuit 2400 may share the input VINN. Connection among the switch elements 2405, 2410, 2420, and 2430 and the capacitive element 2440 may be the same as connection among the switch elements 1405, 1410, 1420, and 1430 and the capacitive element 1440. It may look as if the replica sampler circuit 2400 is provided by replicating the configuration of the main sampler circuit 1400.

However, according to the selection signals RD and RDB, a reference voltage, which is provided to the main sampler circuit 1400, from among the reference voltages REF1 and REF2 may be different from a reference voltage, which is provided to the replica sampler circuit 2400, from among the reference voltages REF1 and REF2. Accordingly, a reference voltage received in the main sampler circuit 1400 in response to the holding signal Phold may be different from a reference voltage received in the replica sampler circuit 2400 in response to the holding signal Phold.

Meanwhile, the replica sampler circuit 2400 may not be directly connected with the amplifier 1510. The amplifier 1510 may not use an output from the replica sampler circuit 2400 (e.g., may not use the charges stored in the capacitive element 2440).

Figure 12:
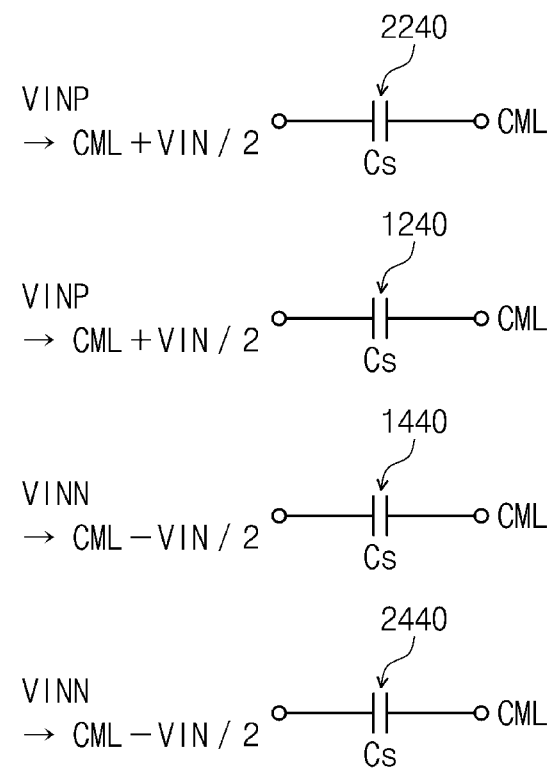
FIGS. 12 to 14 are conceptual diagrams for describing example voltages provided to capacitive elements of FIGS. 10 and 11 with regard to graphs of FIGS. 2 and 3.
Figure 13:
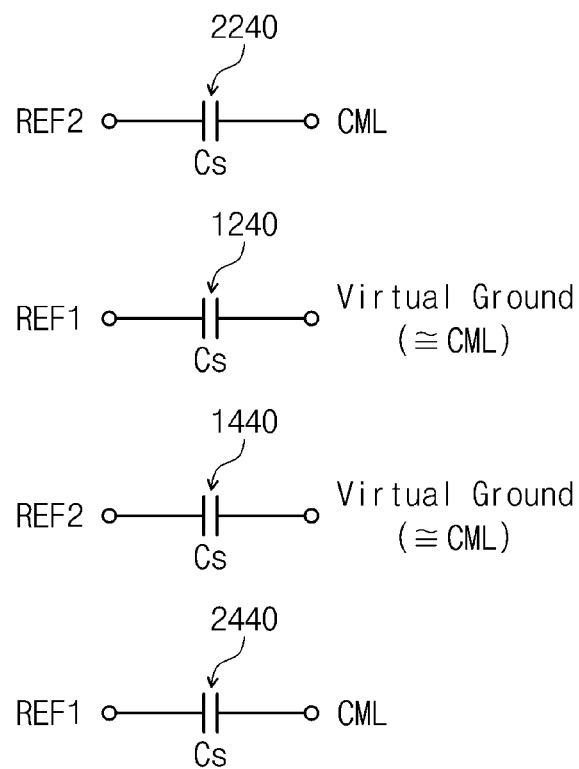
Figure 14:
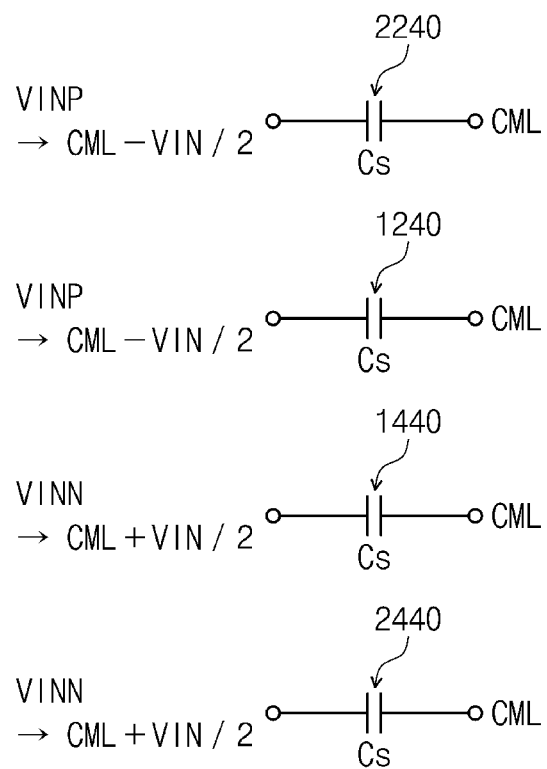

FIGS. 12 to 14 are conceptual diagrams for describing example voltages provided to the capacitive elements 1240, 1440, 2240, and 2240 of FIGS. 10 and 11 with regard to the graphs of FIGS. 2 and 3. The voltages provided to the capacitive elements 1240 and 1440 have been described with reference to FIGS. 4 to 6, and thus descriptions associated with the capacitive elements 1240 and 1440 will be omitted below for brevity.

FIG. 12 illustrates voltages provided to the capacitive elements 1240, 1440, 2240, and 2440 in the sampling period between time t0 and t1. Referring to FIGS. 2, 3, 10, and 11 together, in the sampling period between time t0 and t1, the input VINP of the level of "CML+VIN/2" and the common mode voltage CML may be provided to opposite ends of the capacitive element 2240. In addition, the input VINN of the level of "CML−VIN/2" and the common mode voltage CML may be provided to opposite ends of the capacitive element 2440. Accordingly, the capacitive elements 2240 and 2440 may store charges in response to the levels of "CML+VIN/2" and "CML−VIN/2".

FIG. 13 illustrates voltages provided to the capacitive elements 1240, 1440, 2240, and 2440 in the holding periods between time t1 and t2 and between time t3 and t4. Referring to FIGS. 2, 3, 10, and 11 together, in the holding periods, the reference voltages REF2 and REF1 may be respectively provided to first ends of the capacitive elements 2240 and 2440. Accordingly, the charges stored in the capacitive elements 2240 and 2440 may be held in the capacitive elements 2240 and 2440, based on the reference voltages REF2 and REF1.

Referring to FIG. 13, it may be understood that voltages provided to opposite ends of the capacitive element 1240 are equivalent to voltages provided to opposite ends of the capacitive element 2440. In addition, it may be understood that voltages provided to opposite ends of the capacitive element 1440 are equivalent to voltages provided to opposite ends of the capacitive element 2240. Herein, "equivalent" may mean that two values are identical or are similar within an acceptable error range without a great difference.

FIG. 14 illustrates voltages provided to the capacitive elements 1240, 1440, 2240, and 2440 in the sampling period between time t2 and t3. Referring to FIGS. 2, 3, 10, and 11 together, in the sampling period between time t2 and t3, the input VINP of the level of "CML−VIN/2" and the common mode voltage CML may be provided to opposite ends of the capacitive element 2240. In addition, the input VINN of the level of "CML+VIN/2" and the common mode voltage CML may be provided to opposite ends of the capacitive element 2440. Accordingly, the capacitive elements 2240 and 2440 may store charges in response to the levels of "CML−VIN/2" and "CML+VIN/2".

Figure 15:
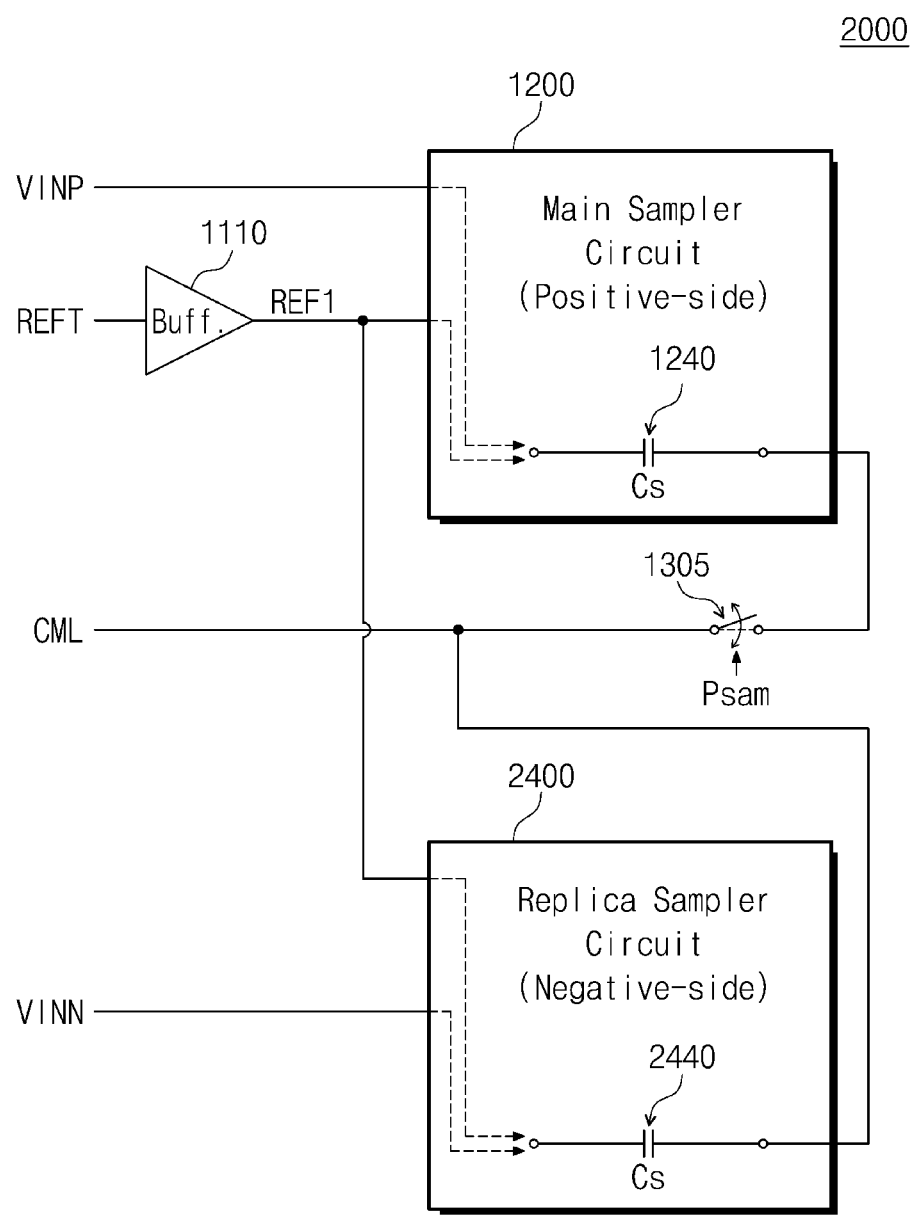
FIG. 15 is a block diagram illustrating an example configuration for supplying charges based on a reference voltage in a switched capacitor circuit of FIG. 9.

FIG. 15 is a block diagram illustrating an example configuration for supplying charges based on the reference voltage REF1 in the switched capacitor circuit 2000 of FIG. 9.

The main sampler circuit 1200 and the replica sampler circuit 2400 may receive different inputs VINP and VINN. In response to the sampling signal Psam, the inputs VINP and VINN may be respectively transferred to the capacitive elements 1240 and 2440.

Meanwhile, the main sampler circuit 1200 and the replica sampler circuit 2400 may share the same reference voltage. For example, when the selection signal RD is received, the main sampler circuit 1200 and the replica sampler circuit 2400 may share the reference voltage REF1. In response to the holding signal Phold, the reference voltage REF1 may be provided to each of the capacitive elements 1240 and 2440.

Figure 16:
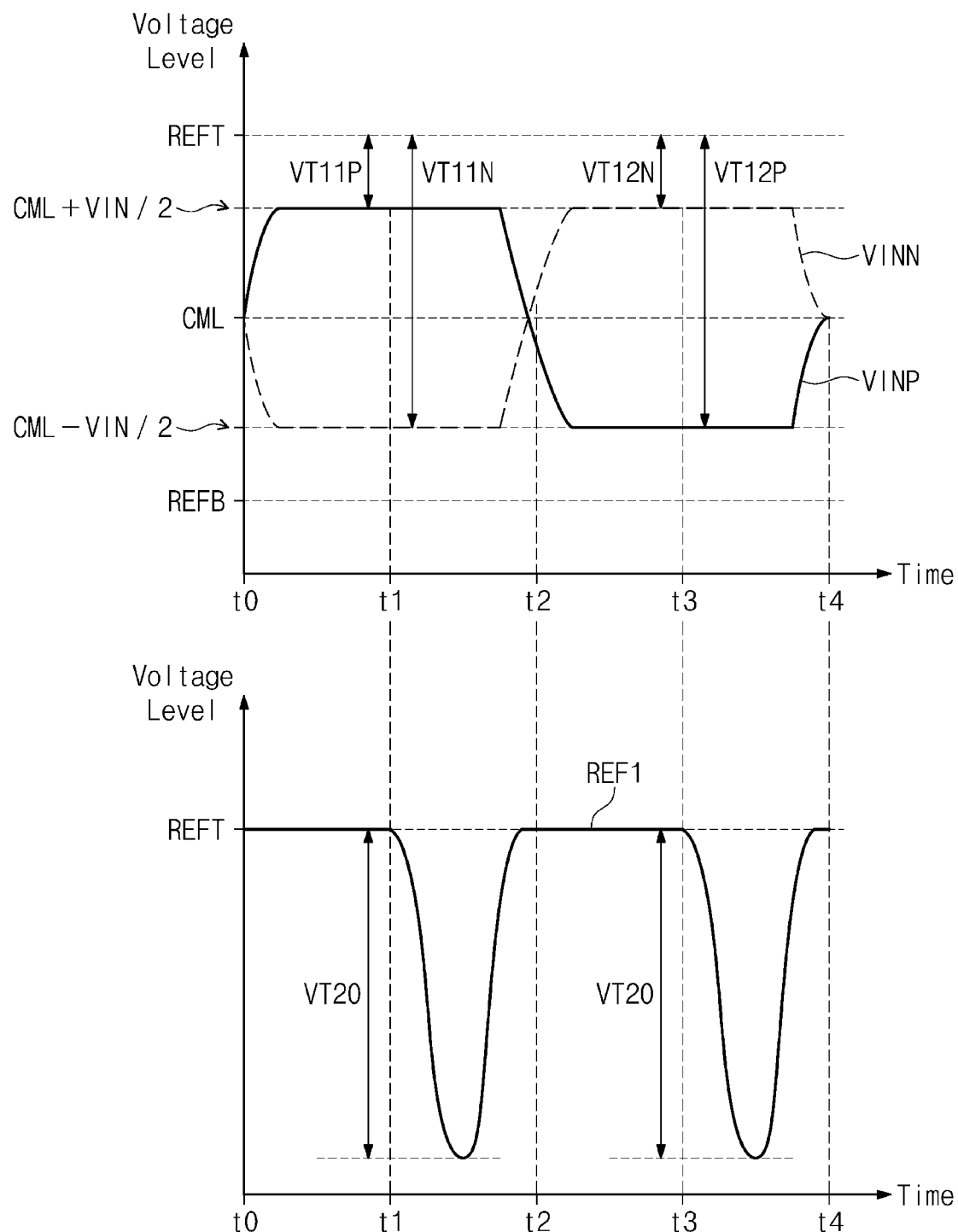
FIG. 16 illustrates graphs for describing an example change in a level of a reference voltage with regard to a switched capacitor circuit of FIG. 15.

FIG. 16 illustrates graphs for describing an example change in the level of the reference voltage REF1 with regard to the switched capacitor circuit 2000 of FIG. 15.

For example, in the sampling period between time t0 and t1, the input VINP of the level of "CML+VIN/2" may be provided to the capacitive element 1240, and the input VINN of the level of "CML−VIN/2" may be provided to the capacitive element 2440. Afterwards, in the holding period between time t1 and t2, the reference voltage REF1 may be provided to the capacitive elements 1240 and 2440.

In the holding period between time t1 and t2, the capacitive element 1240 may require additional charges as much as an amount of charges "Cs×VT11P" corresponding to a voltage difference "VT11P (=REFT−(CML+VIN/2))", and the capacitive element 2440 may require additional charges as much as an amount of charges "Cs×VT11N" corresponding to a voltage difference "VT11N (=REFT−(CML−VIN/2))". These additional charges may be supplied based on the reference voltage REF1. The total amount of additional charges to be supplied based on the reference voltage REF1 may be "Cs×(VT11P+VT11N)", i.e., "2×Cs×(REFT−CML)".

Meanwhile, in the sampling period between time t2 and t3, the input VINP of the level of "CML−VIN/2" may be provided to the capacitive element 1240, and the input VINN of the level of "CML+VIN/2" may be provided to the capacitive element 2440. Afterwards, in the holding period between time t3 and t4, the reference voltage REF1 may be provided to the capacitive elements 1240 and 2440.

In the holding period between time t3 and t4, the capacitive element 1240 may require additional charges as much as an amount of charges "Cs×VT12P" corresponding to a voltage difference "VT12P (=REFT−(CML−VIN/2))", and the capacitive element 2440 may require additional charges as much as an amount of charges "Cs×VT12N" corresponding to a voltage difference "VT12N (=REFT−(CML+VIN/2))". These additional charges may be supplied based on the reference voltage REF1. The total amount of additional charges to be supplied based on the reference voltage REF1 may be "Cs×(VT12P+VT12N)", i.e., "2×Cs×(REFT−CML)".

Unlike the example of FIG. 7, in the example of FIG. 16, the amount of additional charges required in the holding period between time t1 and t2 may be identical to the amount of additional charges required in the holding period between time t3 and t4. Accordingly, in the holding periods between time t1 and t2 and between time t3 and t4, the level of the reference voltage REF1 may change by the same amount. For example, the level of the reference voltage REF1 may change as much as a variation amount VT20 from the level of the main reference voltage REFT and then may be restored to the level of the main reference voltage REFT.

Figure 17:
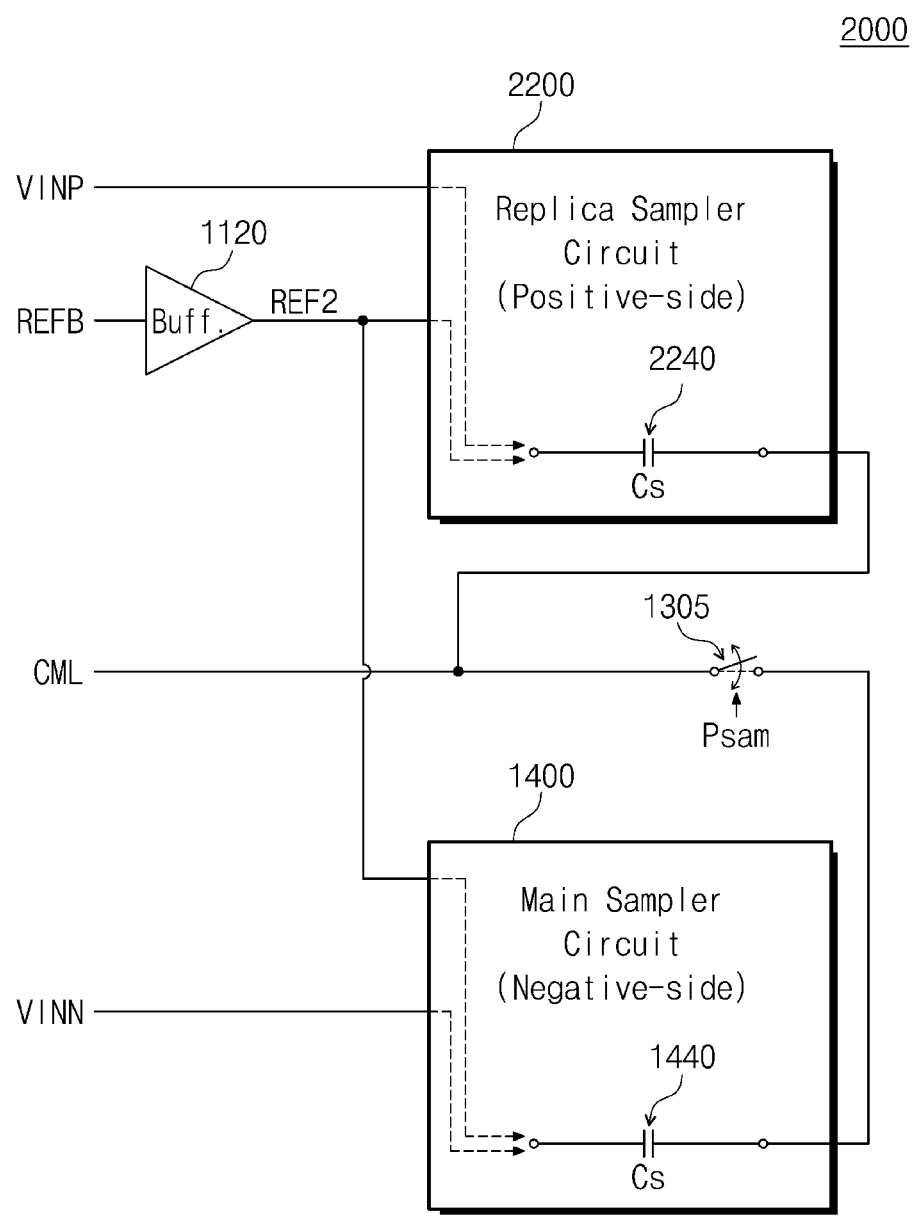
FIG. 17 is a block diagram illustrating an example configuration for supplying charges based on a reference voltage in a switched capacitor circuit of FIG. 9.

FIG. 17 is a block diagram illustrating an example configuration for supplying charges based on the reference voltage REF2 in the switched capacitor circuit 2000 of FIG. 9.

The main sampler circuit 1400 and the replica sampler circuit 2200 may receive different inputs VINN and VINP. In response to the sampling signal Psam, the inputs VINN and VINP may be respectively transferred to the capacitive elements 1440 and 2240.

Meanwhile, the main sampler circuit 1400 and the replica sampler circuit 2200 may share the same reference voltage. For example, when the selection signal RD is received, the main sampler circuit 1400 and the replica sampler circuit 2200 may share the reference voltage REF2. In response to the holding signal Phold, the reference voltage REF2 may be provided to each of the capacitive elements 1440 and 2240.

Figure 18:
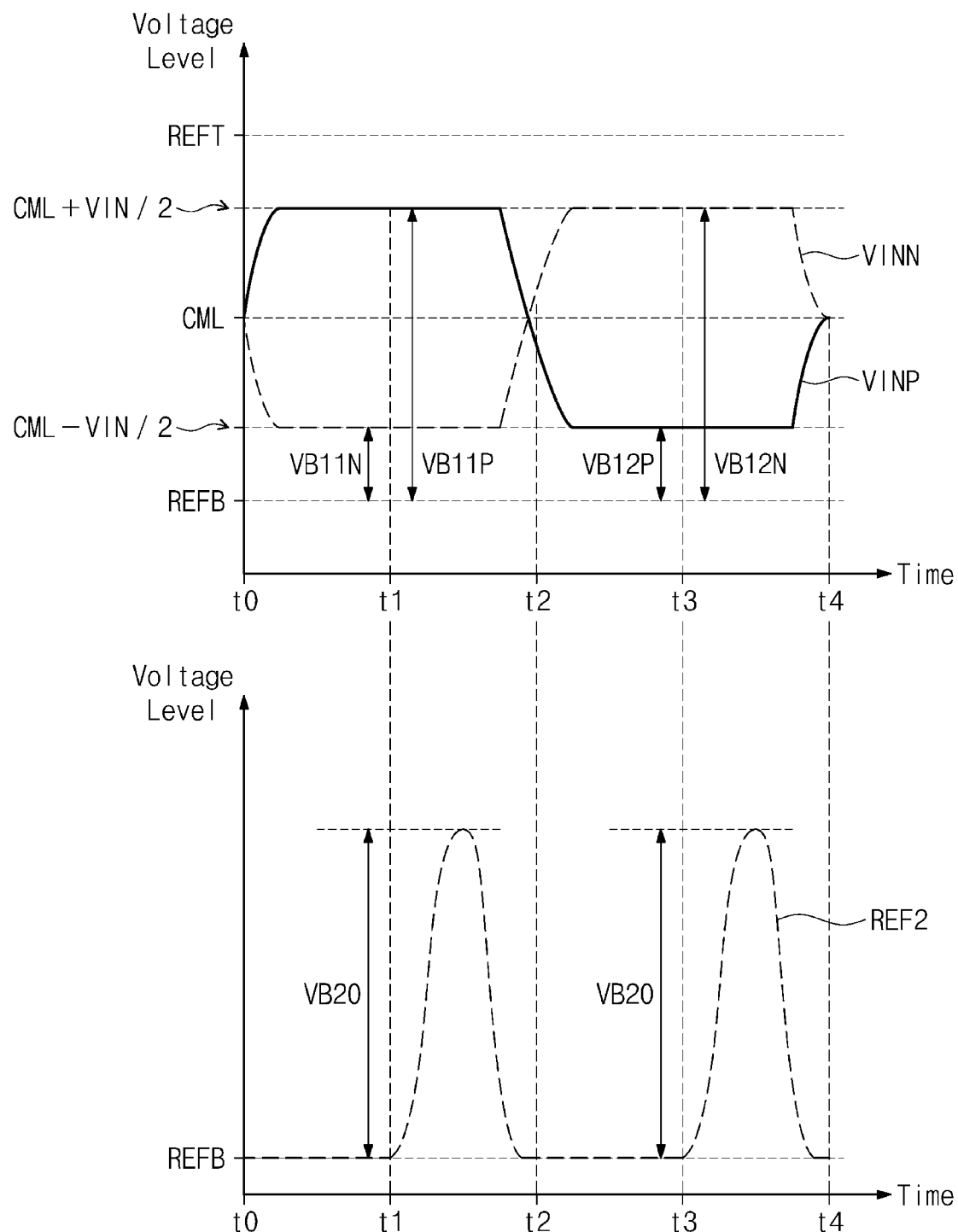
FIG. 18 illustrates graphs for describing an example change in a level of a reference voltage with regard to a switched capacitor circuit of FIG. 17.

FIG. 18 illustrates graphs for describing an example change in the level of the reference voltage REF2 with regard to the switched capacitor circuit 2000 of FIG. 17.

For example, in the sampling period between time t0 and t1, the input VINN of the level of "CML−VIN/2" may be provided to the capacitive element 1440, and the input VINP of the level of "CML+VIN/2" may be provided to the capacitive element 2240. Afterwards, in the holding period between time t1 and t2, the reference voltage REF2 may be provided to the capacitive elements 1440 and 2240.

In the holding period between time t1 and t2, the capacitive element 1440 may require additional charges as much as an amount of charges "Cs×VB11N" corresponding to a voltage difference "VB11N (=(CML−VIN/2)−REFB)", and the capacitive element 2240 may require additional charges as much as an amount of charges "Cs×VB11P" corresponding to a voltage difference "VB11P (=(CML+VIN/2)−REFB)". These additional charges may be supplied based on the reference voltage REF2. The total amount of additional charges to be supplied based on the reference voltage REF2 may be "Cs×(VB11P+VB11N)", that is, "2×Cs×(CML−REFB)".

Meanwhile, in the sampling period between time t2 and t3, the input VINN of the level of "CML+VIN/2" may be provided to the capacitive element 1440, and the input VINP of the level of "CML−VIN/2" may be provided to the capacitive element 2240. Afterwards, in the holding period between time t3 and t4, the reference voltage REF2 may be provided to the capacitive elements 1440 and 2240.

In the holding period between time t3 and t4, the capacitive element 1440 may require additional charges as much as an amount of charges "Cs×VB12N" corresponding to a voltage difference "VB12N (=(CML+VIN/2)−REFB)", and the capacitive element 2240 may require additional charges as much as an amount of charges "Cs×VB12P" corresponding to a voltage difference "VB12P (=(CML−VIN/2)−REFB)". The additional charges may be supplied based on the reference voltage REF2. The total amount of additional charges to be supplied based on the reference voltage REF2 may be "Cs×(VB12P+VB12N)", that is, "2×Cs×(CML−REFB)".

Unlike the example of FIG. 8, in the example of FIG. 18, the amount of additional charges required in the holding period between time t1 and t2 may be identical to the amount of additional charges required in the holding period between time t3 and t4. Accordingly, in the holding periods between time t1 and t2 and between time t3 and t4, the level of the reference voltage REF2 may change by the same amount. For example, the level of the reference voltage REF2 may change as much as a variation amount VB20 from the level of the main reference voltage REFB and then may be restored to the level of the main reference voltage REFB.

Referring to FIGS. 16 and 18, a sum of the voltage differences "VT11P" and "VT11N" may be substantially identical to a sum of the voltage differences "VB11P" and "VB11N". In addition, a sum of the voltage differences "VT12P" and "VT12N" may be substantially identical to a sum of the voltage differences "VB12P" and "VB12N". In this regard, an amount of charges supplied to the main sampler circuit 1200 and the replica sampler circuit 2400 based on the reference voltage REF1 may be equivalent to an amount of charges supplied to the main sampler circuit 1400 and the replica sampler circuit 2200 based on the reference voltage REF2.

Referring to FIG. 16, the sum of the voltage differences "VT11P" and "VT11N" may be substantially identical to the sum of the voltage differences "VT12P" and "VT12N". In this regard, the amount of charges supplied to the main sampler circuit 1200 and the replica sampler circuit 2400 based on the reference voltage REF1 may be maintained to be even regardless of the levels of the inputs VINP and VINN (e.g., regardless of a data value intended by the differential input VINP and VINN). Herein, "even" may mean that a value approximately remains at the same level within an acceptable error range without a great variation.

Referring to FIG. 18, the sum of the voltage differences "VB11P" and "VB11N" may be substantially identical to the sum of the voltage differences "VB12P" and "VB12N". In this regard, the amount of charges supplied to the main sampler circuit 1400 and the replica sampler circuit 2200 based on the reference voltage REF2 may be maintained to be even regardless of the levels of the inputs VINP and VINN.

Referring to FIGS. 16 and 18, a sum of the voltage differences "VT11P" and "VB11P" may be substantially identical to a sum of the voltage differences "VB11N" and "VT11N". In addition, a sum of the voltage differences "VT12P" and "VB12P" may be substantially identical to a sum of the voltage differences "VB12N" and "VT12N". In this regard, an amount of charges, which are supplied to the main sampler circuit 1200 based on the reference voltage REF1 and are supplied to the replica sampler circuit 2200 based on the reference voltage REF2, may be equivalent to an amount of charges, which are supplied to the main sampler circuit 1400 based on the reference voltage REF2 and are supplied to the replica sampler circuit 2400 based on the reference voltage REF1.

Referring to FIGS. 16 and 18, a sum of the voltage differences "VT11P" and "VB11P" may be substantially identical to a sum of the voltage differences "VT12P" and "VB12P". In this regard, an amount of charges, which are supplied to the main sampler circuit 1200 based on the reference voltage REF1 and are supplied to the replica sampler circuit 2200 based on the reference voltage REF2, may be maintained to be even regardless of the levels of the inputs VINP and VINN.

Referring to FIGS. 16 and 18, a sum of the voltage differences "VB11N" and "VT11N" may be substantially identical to a sum of the voltage differences "VB12N" and "VT12N". In this regard, an amount of charges, which are supplied to the main sampler circuit 1400 based on the reference voltage REF2 and are supplied to the replica sampler circuit 2400 based on the reference voltage REF1, may be maintained to be even regardless of the levels of the inputs VINP and VINN.

Referring to FIG. 16, while the reference voltage REF1 is supplied to the main sampler circuit 1200 and the replica sampler circuit 2400, the level of the reference voltage REF1 may change from the level of the main reference voltage REFT to another level and then may be restored to the level of the main reference voltage VREFT. However, the amount VT20 of change in the level of the reference voltage REF1 may be maintained to be even regardless of the levels of the inputs VINP and VINN.

Referring to FIG. 18, while the reference voltage REF2 is supplied to the main sampler circuit 1400 and the replica sampler circuit 2200, the level of the reference voltage REF2 may change from the level of the main reference voltage REFB to another level and then may be restored to the level of the main reference voltage VREFB. However, the amount VB20 of change in the level of the reference voltage REF2 may be maintained to be even regardless of the levels of the inputs VINP and VINN.

According to the example embodiments described with reference to FIGS. 9 to 18, amounts of change in the levels of the reference voltages REF1 and REF2 may be predictable, and linearity and accuracy of an operation of the switched capacitor circuit 2000 may be improved in comparison to the switched capacitor circuit 1000. In some examples, the switched capacitor circuit 1000 may be implemented including capacitors of a considerably great capacity, which are connected to output terminals of the reference buffers 1110 and 1120 for linearity improvement. However, such capacitors may cause an increase in a circuit area and implementation cost. The example embodiments described with reference to FIGS. 9 to 18 may be implemented with low cost on a small circuit area in comparison to the above example implementation.

Figure 19:
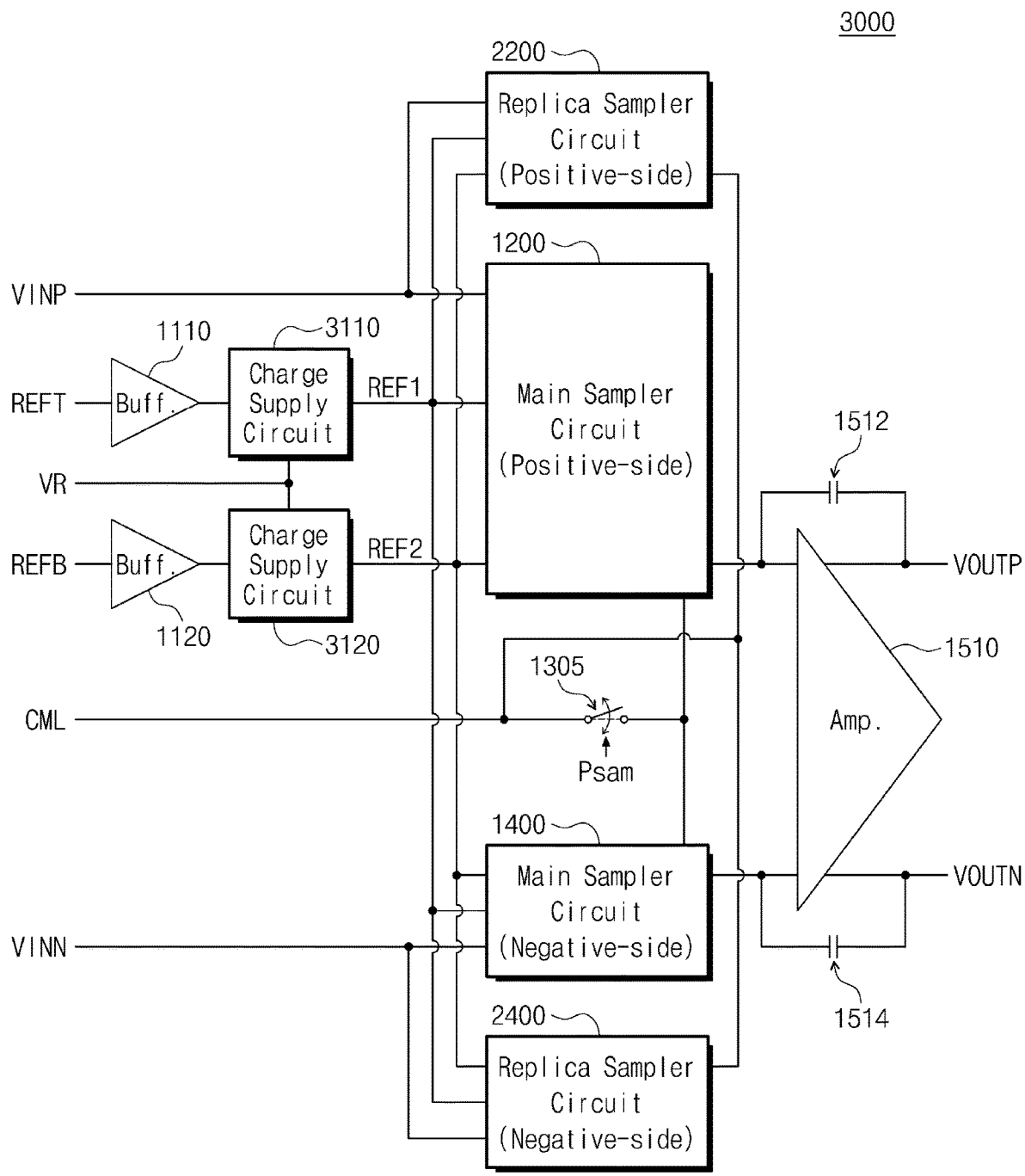
FIG. 19 is a block diagram illustrating an example configuration of a switched capacitor circuit according to some example embodiments.

FIG. 19 is a block diagram illustrating an example configuration of a switched capacitor circuit 3000 according to some example embodiments.

The switched capacitor circuit 3000 may include the reference buffers 1110 and 1120, charge supply circuits 3110 and 3120, the main sampler circuits 1200 and 1400, the replica sampler circuits 2200 and 2400, the switch element 1305, the amplifier 1510, and the capacitive elements 1512 and 1514. The switched capacitor circuit 3000 may be employed for a purpose or function which is the same as or similar to that of the switched capacitor circuit 1000.

The reference buffers 1110 and 1120, the main sampler circuits 1200 and 1400, the replica sampler circuits 2200 and 2400, the switch element 1305, the amplifier 1510, and the capacitive elements 1512 and 1514 may be configured and may operate to be the same as or similar to those described with reference to FIGS. 1 to 18. For brevity, redundant descriptions associated with these components will be omitted below.

As described with reference to FIGS. 16 and 18, the capacitive elements 1240, 1440, 2240, and 2440 may require the additional charges in response to a transition from a sampling period to a holding period. As the replica sampler circuits 2200 and 2400 are employed, the amount of charges required in the switched capacitor circuit 2000 may become greater than the amount of charges required in the switched capacitor circuit 1000. That is, the amount of additional charges to be supplied based on the reference voltages REF1 and REF2 may increase, and this may cause an increase in power consumption of the reference buffers 1110 and 1120.

As will be described with reference to FIGS. 20 to 27, the charge supply circuits 3110 and 3120 may be employed to supply additional charges for the reference voltages REF1 and REF2, i.e., additional charges required in the capacitive elements 1240, 1440, 2240, and 2440. The charge supply circuit 3110 may provide the reference voltage REF1, based on a charge supply voltage VR or based on a buffered reference voltage from the reference buffer 1110. The charge supply circuit 3120 may provide the reference voltage REF2, based on the charge supply voltage VR or based on a buffered reference voltage from the reference buffer 1120. The charge supply voltage VR may be received from a voltage source such as a bandgap reference circuit, a PMIC, a voltage regulator, and/or the like.

Figure 20:
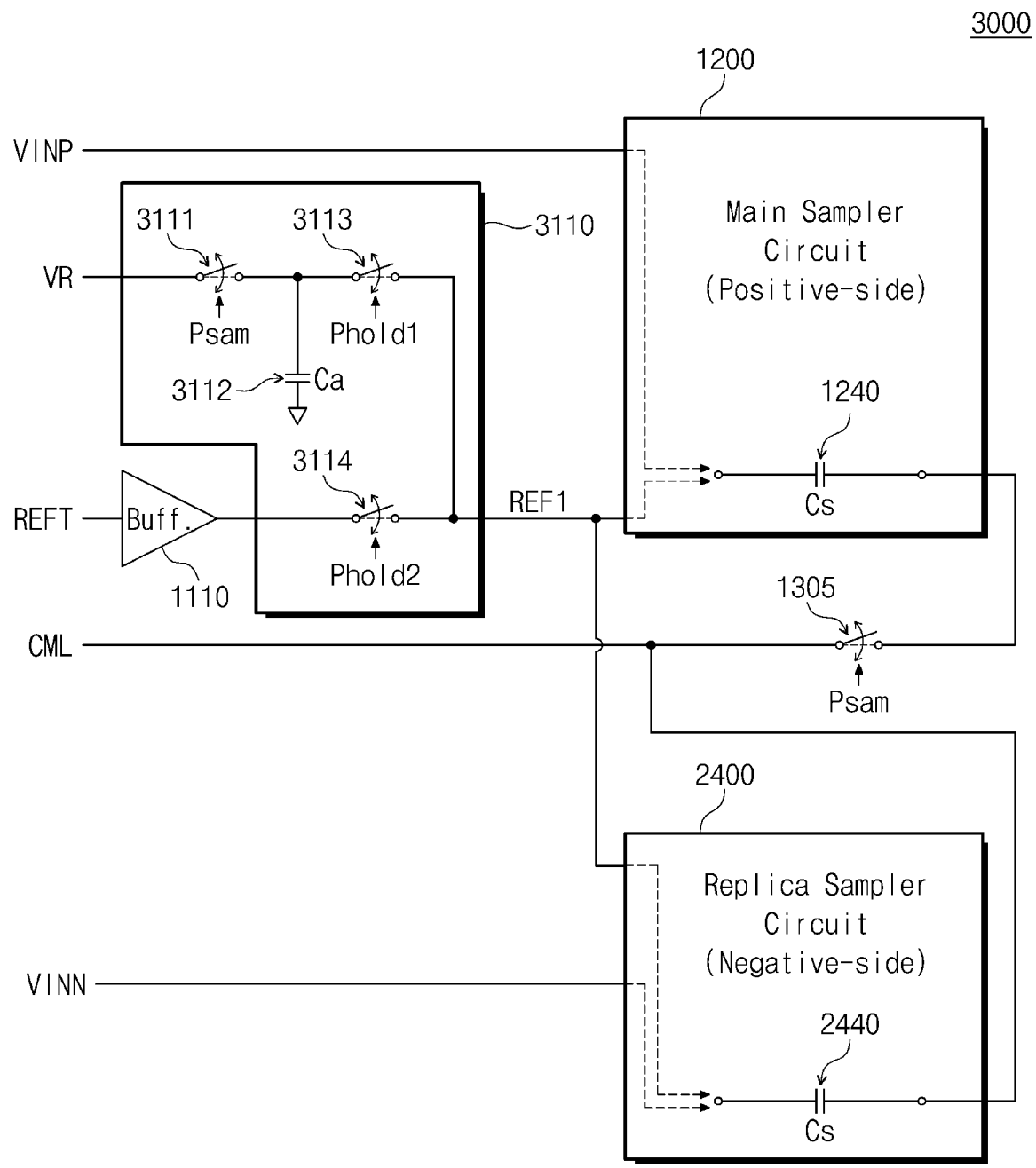
FIG. 20 is a circuit diagram illustrating an example configuration of a switched capacitor circuit of FIG. 19.

FIG. 20 is a circuit diagram illustrating an example configuration of the switched capacitor circuit 3000 of FIG. 19. For example, FIG. 20 illustrates the charge supply circuit 3110 connected to the reference buffer 1110 to provide the reference voltage REF1.

The charge supply circuit 3110 may include switch elements 3111, 3113, and 3114 and a capacitive element 3112. The charge accumulation switch element 3111 may provide the charge supply voltage VR to the capacitive element 3112 in response to the sampling signal Psam. Accordingly, the capacitive element 3112 may store charges based on the charge supply voltage VR, in response to the sampling signal Psam. The capacitive element 3112 may have a capacitance value Ca.

For the reference voltage REF1, the charge supply switch element 3113 may transfer the charges stored in the capacitive element 3112, in response to a sub-holding signal Phold1. For the reference voltage REF1, the voltage settling switch element 3114 may provide a buffered reference voltage from the reference buffer 1110, in response to a sub-holding signal Phold2. The sub-holding signals Phold1 and Phold2 may be received from a separate clock generating circuit or a separate control circuit.

Accordingly, the charge supply circuit 3110 may provide the reference voltage REF1 based on the charges stored in the capacitive element 3112, in response to the sub-holding signal Phold1. In addition, the charge supply circuit 3110 may provide the buffered reference voltage from the reference buffer 1110 as the reference voltage REF1, in response to the sub-holding signal Phold2. The reference voltage REF1 may be provided based selectively on the buffered reference voltage from the reference buffer 1110 or the charges stored in the capacitive element 3112.

Figure 21:
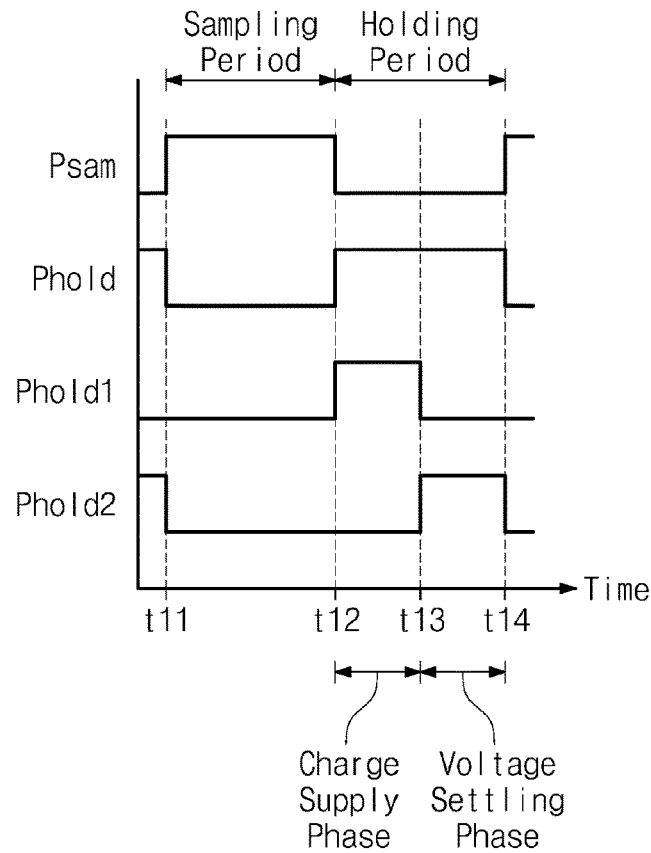
FIG. 21 is a graph for describing example signals for controlling switches of FIG. 20.

FIG. 21 is a graph for describing the example signals Psam, Phold, Phold1, and Phold2 for controlling switches of FIG. 20.

A time period between time t11 and t12 may be a sampling period in which the sampling signal Psam may have the level of logic "1" and the holding signal Phold may have the level of logic "0". A time period between time t12 and t14 may be a holding period in which the sampling signal Psam may have the level of logic "0" and the holding signal Phold may have the level of logic "1".

The holding period may include a time period between time t12 and t13 and a time period between time t13 and t14. The time period between time t12 and t13 may provide a charge supply phase. The time period between time t13 and t14 may provide a voltage settling phase. The time period of the voltage settling phase may follow the time period of the charge supply phase. The time period of the voltage settling phase may not overlap with the time period of the charge supply phase.

In the charge supply phase, the sub-holding signal Phold1 may have a level of logic "1", and the sub-holding signal Phold2 may have a level of logic "0". In the voltage settling phase, the sub-holding signal Phold1 may have a level of logic "0", and the sub-holding signal Phold2 may have a level of logic "1". In the sampling period, the sub-holding signals Phold1 and Phold2 may have the level of logic "0".

For example, the level of logic "1" of the sub-holding signals Phold1 and Phold2 may be understood as the sub-holding signals Phold1 and Phold2 being received. On the other hand, the level of logic "0" of the sub-holding signals Phold1 and Phold2 may be understood as the sub-holding signals Phold1 and Phold2 being not received. In this regard, it may be understood that the sampling signal Psam, the sub-holding signal Phold1, and the sub-holding signal Phold2 are received continuously and sequentially.

Figure 22:
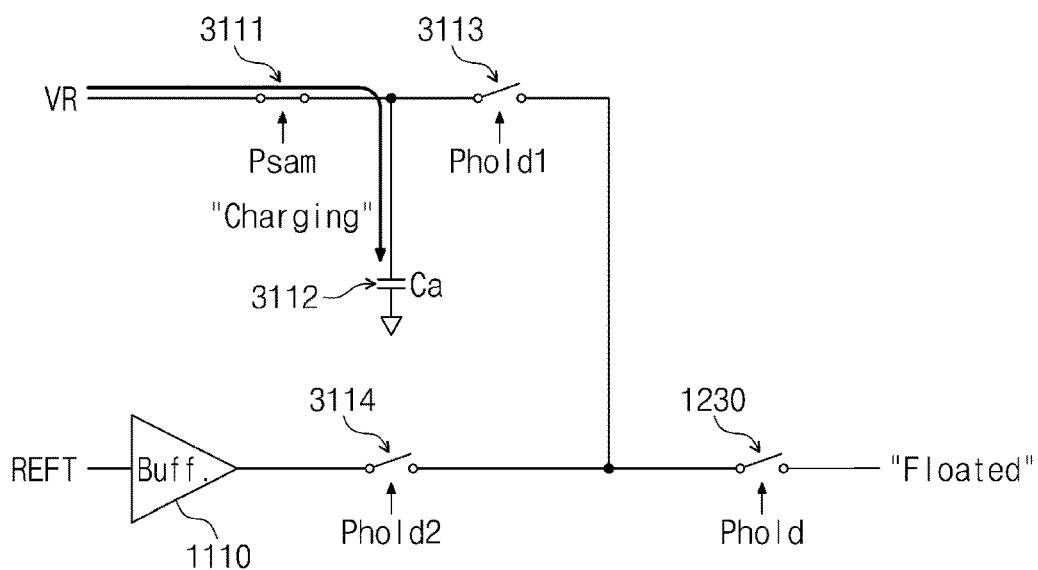
FIGS. 22 to 24 are conceptual diagrams for describing operations of a charge supply circuit of FIG. 20 according to example signals of FIG. 21.
Figure 23:
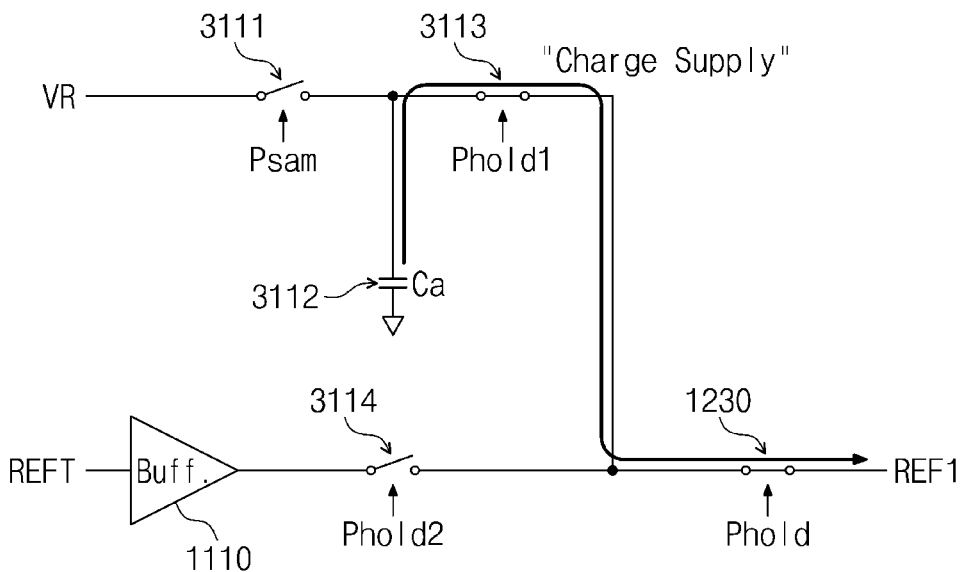
Figure 24:
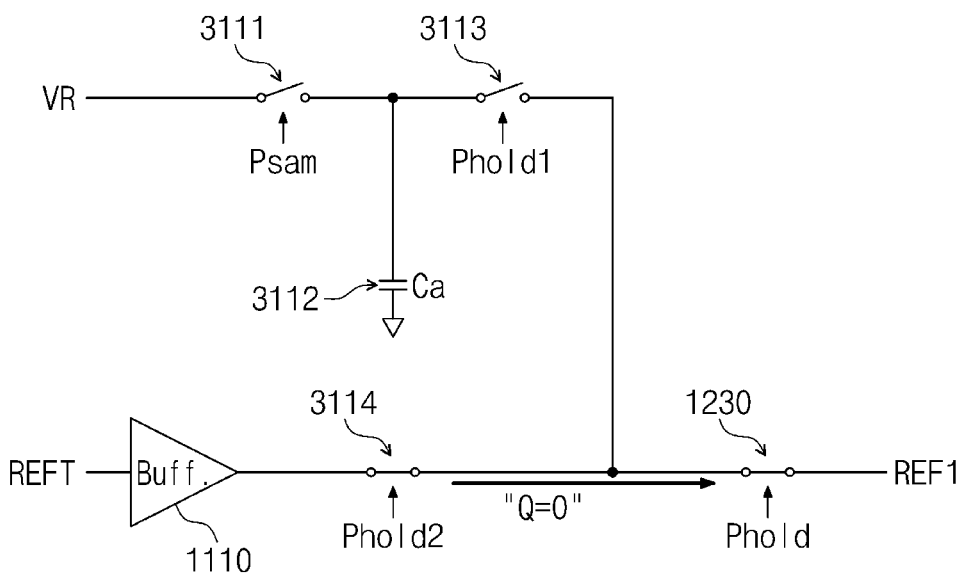

FIGS. 22 to 24 are conceptual diagrams for describing operations of the charge supply circuit 3110 of FIG. 20 according to the example signals Psam, Phold, Phold1, and Phold2 of FIG. 21.

FIG. 22 illustrates an operation of the charge supply circuit 3110 in a sampling period which is provided in response to the sampling signal Psam. In the sampling period, while the main sampler circuits 1200 and 1400 and the replica sampler circuits 2200 and 2400 receive the inputs VINP and VINN, the capacitive element 3112 may store charges based on the charge supply voltage VR. Meanwhile, as the holding signal Phold is not received, connection to the capacitive elements 1240 and 2440 may be floated (e.g., disconnected).

FIG. 23 illustrates an operation of the charge supply circuit 3110 in a time period of the charge supply phase which is provided in response to the sub-holding signal Phold1. While the sub-holding signal Phold1 is received, the sampling signal Psam may not be received and the holding signal Phold may be received.

In the charge supply phase, the charge supply circuit 3110 may provide the reference voltage REF1 based on the charges stored in the capacitive element 3112. As described with reference to FIGS. 16 and 18, the reference voltage REF1 may be provided to supply the additional charges required by the capacitive elements 1240 and 2440. When the charge supply circuit 3110 is employed, the additional charges may be supplied based on the charges stored in the capacitive element 3112, instead of being supplied from the reference buffer 1110.

FIG. 24 illustrates an operation of the charge supply circuit 3110 in a time period of the voltage settling phase which is provided in response to the sub-holding signal Phold2. While the sub-holding signal Phold2 is received, the sampling signal Psam may not be received and the holding signal Phold may be received.

In the voltage settling phase, the charge supply circuit 3110 may provide the buffered reference voltage from the reference buffer 1110 as the reference voltage REF1. Accordingly, the level of the reference voltage REF1 may be settled to the level of the main reference voltage REFT.

In some example embodiments, a voltage level of the charge supply voltage VR and/or the capacitance value Ca of the capacitive element 3112 may be determined to be sufficient to fully supply the additional charges required by the capacitive elements 1240 and 2440, which will be described with reference to FIGS. 25 and 26. In such example embodiments, the reference buffer 1110 may not output charges for the reference voltage REF1. That is, while the charge supply circuit 3110 provides the buffered reference voltage from the reference buffer 1110 as the reference voltage REF1, an amount of charges transferred from the reference buffer 1110 to the capacitive elements 1240 and 2440 may be zero (0).

When the reference buffer 1110 does not supply charges to the capacitive elements 1240 and 2440, the reference buffer 1110 may hardly consume power. Even though the capacitive element 3112 does not fully supply the additional charges due to an insufficient capacitance value Ca of the capacitive element 3112, power consumption of the reference buffer 1110 may be markedly reduced. Accordingly, when the charge supply circuit 3110 is employed to supply the additional charges, power consumption of the switched capacitor circuit 3000 may be reduced.

Referring to FIG. 23, the additional charges required by the capacitive elements 1240 and 2440 may be provided from the charges stored in the capacitive element 3112. That is, the additional charges may be transferred through charge sharing between the capacitive elements 1240 and 2440 and the capacitive element 3112. Accordingly, it may take a considerably short time to supply the additional charges, and the level of the reference voltage REF1 may be rapidly settled.

In addition, referring to FIG. 24, charges which are additionally transferred from the reference buffer 1110 to the capacitive elements 1240 and 2440 may not exist or may be minimized. As a result, the switched capacitor circuit 3000 may operate rapidly, and may be usefully employed in a high-speed system.

Referring to FIGS. 21 to 24 together, when a length of the time period of the charge supply phase is longer, the charge supply circuit 3110 may supply the more amounts of additional charges. Accordingly, power consumption of the switched capacitor circuit 3000 may be further reduced. On the other hand, when a length of the time period of the voltage settling phase is longer, the level of the reference voltage REF1 may be settled rapidly and stably. In these regards, each length of the time periods of the charge supply phase and the voltage settling phase may be suitably determined taking into account power consumption and stability.

Figure 25:
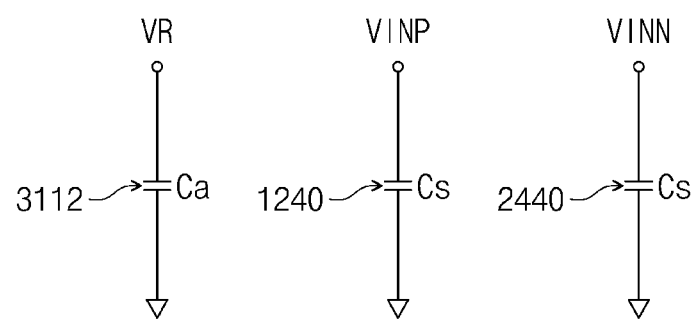
FIGS. 25 and 26 are conceptual diagrams for describing an example method of determining a capacitance value of a capacitive element or a level of a charge supply voltage of FIG. 20.
Figure 26:
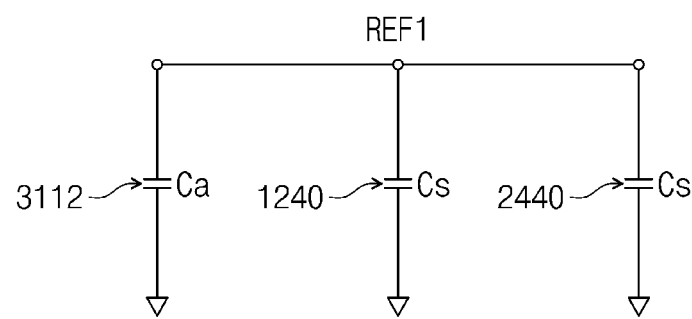

FIGS. 25 and 26 are conceptual diagrams for describing an example method of determining the capacitance value Ca of the capacitive element 3112 or a level of the charge supply voltage VR of FIG. 20.

FIG. 25 illustrates voltages provided to the capacitive elements 1240, 2440, and 3112 in the sampling period. In the sampling period, the capacitive elements 1240 and 2440 may respectively receive the inputs VINP and VINN, and the capacitive element 3112 may receive the charge supply voltage VR. The total amount "Qsam" of charges stored in the capacitive elements 1240, 2440, and 3112 in the sampling period may be described by the following equation 1.

$$Q\text{sam} = Ca \times VR + Cs \times (VINP + VINN) = Ca \times VR + 2 \times Cs \times CML \qquad \text{[Equation 1]}$$

FIG. 26 illustrates voltages provided to the capacitive elements 1240, 2440, and 3112 in the charge supply phase. In the charge supply phase, the capacitive elements 1240, 2440, and 3112 may receive the reference voltage REF1. The reference voltage REF1 may be driven to have the level of the main reference voltage REFT. The total amount "Qhold1" of charges stored in the capacitive elements 1240, 2440, and 3112 in the charge supply phase may be described by the following equation 2.

$$Q\text{hold1} = (Ca + 2 \times Cs) \times REFT \qquad \text{[Equation 2]}$$

In response to a transition from the sampling period to the charge supply phase, charges stored in the capacitive elements 1240, 2440, and 3112 may be redistributed. Considering the charge redistribution, it may be understood that the charge amount "Qsam" is equal to the charge amount "Qhold1". Accordingly, the level of the charge supply voltage VR may be determined according to the following equation 3.

$$VR = \left(1 + 2\frac{Cs}{Ca}\right)REFT - \left(2\frac{Cs}{Ca}\right)CML \qquad \text{[Equation 3]}$$

For example, when the switched capacitor circuit 3000 is designed such that the capacitance value Ca of the capacitive element 3112 is four times the capacitance value Cs of each of the capacitive elements 1240 and 2440 (i.e., Ca=4×Cs), the level of the charge supply voltage VR may be determined according to the following equation 4.

$$VR = \frac{3}{2}REFT - \frac{1}{2}CML \qquad \text{[Equation 4]}$$

In this example, a voltage source for providing the charge supply voltage VR may be configured to output a voltage having a level which is determined according to the above equation 4. However, in other examples, when a relationship between the capacitance value Ca and the capacitance value Cs is changed, the level of the charge supply voltage VR may be determined in a different manner from the above equation 4.

The above descriptions have provided an example method of determining the level of the charge supply voltage VR. Similarly, the above example method may be changed or modified to determine the capacitance value Ca of the capacitive element 3112. For example, the above equation 3 may be converted to describe the capacitance value Ca, and the capacitance value Ca may be determined depending on a relationship among the levels of the charge supply voltage VR, the main reference voltage REFT, and the common mode voltage CML. This process may be readily understood with a calculation of elementary algebra, and thus detailed descriptions thereof will be omitted below.

Figure 27:
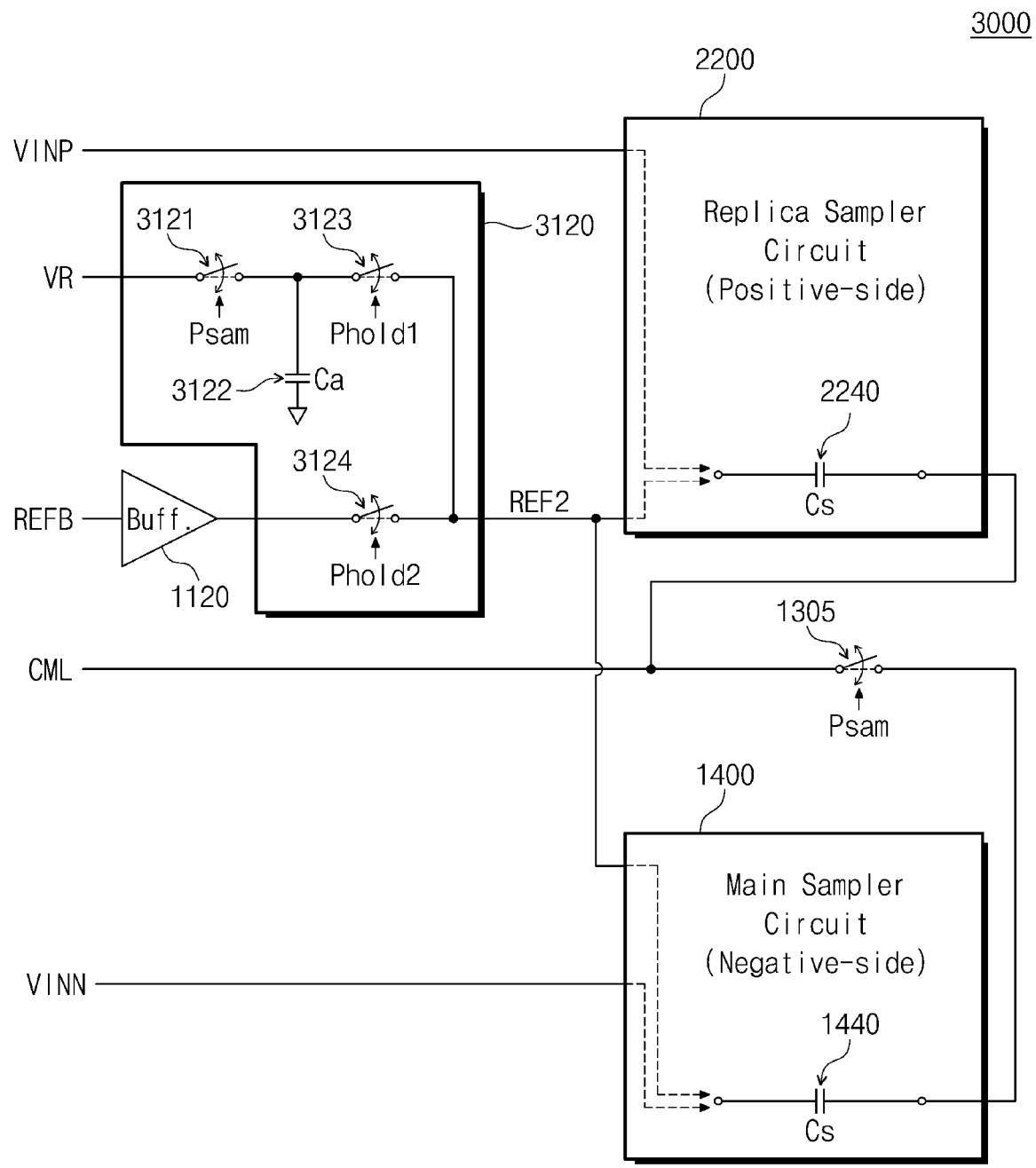
FIG. 27 is a circuit diagram illustrating an example configuration of a switched capacitor circuit of FIG. 19.

FIG. 27 is a circuit diagram illustrating an example configuration of the switched capacitor circuit 3000 of FIG. 19. For example, FIG. 27 illustrates the charge supply circuit 3120 connected to the reference buffer 1120 to provide the reference voltage REF2.

The charge supply circuit 3120 may include switch elements 3121, 3123, and 3124 and a capacitive element 3122. In the sampling period, the charge accumulation switch element 3121 may provide the charge supply voltage VR to the capacitive element 3122 in response to the sampling signal Psam. Accordingly, the capacitive element 3122 may store charges based on the charge supply voltage VR, in response to the sampling signal Psam. The capacitive element 3122 may have a capacitance value Ca.

In the charge supply phase, for the reference voltage REF2, the charge supply switch element 3123 may transfer the charges stored in the capacitive element 3122, in response to the sub-holding signal Phold1. The charge supply circuit 3120 may provide the reference voltage REF2 based on the charges stored in the capacitive element 3122, in response to the sub-holding signal Phold1. The additional charges required by the capacitive elements 1440 and 2240 may be supplied based on the charges stored in the capacitive element 3122, instead of being supplied from the reference buffer 1120.

In the voltage settling phase, for the reference voltage REF2, the voltage settling switch element 3124 may provide the buffered reference voltage from the reference buffer 1120, in response to the sub-holding signal Phold2. The charge supply circuit 3120 may provide the buffered reference voltage from the reference buffer 1120 as the reference voltage REF2, in response to the sub-holding signal Phold2. The reference buffer 1120 may not output charges for the reference voltage REF2, and an amount of charges transferred from the reference buffer 1120 to the capacitive elements 1440 and 2240 may be zero or may be minimized.

The reference voltage REF2 may be provided based selectively on the buffered reference voltage from the reference buffer 1120 or the charges stored in the capacitive element 3122. It may be readily understood that configurations, operations, and methods described with reference to FIGS. 20 to 26 are substantially identically or similarly applied to the charge supply circuit 3120. Accordingly, detailed descriptions will be omitted below.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The above descriptions are intended to provide example configurations and operations for implementing the present disclosure. The scope and spirit of the present disclosure may include implementations which are obtained by simply changing or modifying the above example embodiments, in addition to the above-described example embodiments. Also, the scope and spirit of the present disclosure includes implementations which are accomplished by easily changing or modifying the above-described example embodiments afterwards.

What is claimed is:

1. A switched capacitor circuit comprising:
a main sampler circuit comprising a first capacitive element that stores charges corresponding to one input of a differential input, a first sampling switch element that transfers the one input to the first capacitive element, and a first holding switch element that provides a first reference voltage to the first capacitive element;
a replica sampler circuit comprising a second capacitive element that stores charges corresponding to the one input, a second sampling switch element that transfers the one input to the second capacitive element, and a second holding switch element that provides the second capacitive element with a second reference voltage which is different from the first reference voltage;
an amplifier that generates an output, based on the charges stored in the first capacitive element;
a first reference buffer that buffers a first input reference voltage to output a first buffered reference voltage; and
a second reference buffer that buffers a second input reference voltage to output a second buffered reference voltage, wherein
a connection of the second capacitive element, the second sampling switch element, and the second holding switch element is identical to a connection of the first capacitive element, the first sampling switch element, and the first holding switch element.

2. The switched capacitor circuit of claim 1, wherein the amplifier does not use the charges stored in the second capacitive element.

3. The switched capacitor circuit of claim 1, wherein an amount of charges, which are supplied to the main sampler circuit based on the first reference voltage and are supplied to the replica sampler circuit based on the second reference voltage, is maintained to be even regardless of a level of the one input.

4. The switched capacitor circuit of claim 1, further comprising:
a first charge supply circuit that provides the first reference voltage, based on a charge supply voltage or based on the first buffered reference voltage; and
a second charge supply circuit that provides the second reference voltage, based on the charge supply voltage or based on the second buffered reference voltage.

5. A switched capacitor circuit comprising:
a main sampler circuit comprising a first capacitive element that stores charges corresponding to a first input of a differential input, wherein the main sampler circuit generates an output corresponding to the charges stored in the first capacitive element based on a reference voltage;
a replica sampler circuit comprising a second capacitive element that stores charges corresponding to a second input of the differential input, wherein the replica sampler circuit holds the charges stored in the second capacitive element based on the reference voltage; and
a switch element configured to provide a common mode voltage to the first capacitive element in response to a sampling signal, wherein
an amount of charges supplied to the main sampler circuit and the replica sampler circuit based on the reference voltage is maintained to be even regardless of levels of the first and second inputs.

6. The switched capacitor circuit of claim 5, wherein while the main sampler circuit generates the output and the replica sampler circuit holds the charges stored in the second capacitive element, voltages provided to opposite ends of the first capacitive element are equivalent to voltages provided to opposite ends of the second capacitive element.

7. The switched capacitor circuit of claim 5, further comprising a reference buffer that buffers a main reference voltage to output a buffered reference voltage.

8. The switched capacitor circuit of claim 7, further comprising a charge supply circuit comprising a third capacitive element that stores charges based on a charge supply voltage while the main sampler circuit and the replica sampler circuit respectively receive the first input and the second input.

9. The switched capacitor circuit of claim 8, wherein the reference voltage is provided based selectively on the buffered reference voltage or the charges stored in the third capacitive element.

10. The switched capacitor circuit of claim 8, wherein:
the charge supply circuit:
provides, in a first time period, the reference voltage based on the charges stored in the third capacitive element, and
provide, in a second time period, the buffered reference voltage as the reference voltage, and
the second time period follows the first time period and does not overlap with the first time period.

11. A switched capacitor circuit comprising:
a differential amplifier having first and second differential input terminals;
a first sampling circuit comprising a first capacitor;
a second sampling circuit comprising a second capacitor;
a third sampling circuit comprising a third capacitor; and
a fourth sampling circuit comprising a fourth capacitor, wherein:
during a first period of time:
the first sampling circuit charges the first capacitor with a first voltage generated between a first differential input signal and a common mode voltage,
the second sampling circuit charges the second capacitor with a second voltage generated between the first differential input signal and the common mode voltage,
the third sampling circuit charges the third capacitor with a third voltage generated between a second differential input signal and the common mode voltage, and
the fourth sampling circuit charges the fourth capacitor with a fourth voltage generated between the second differential input signal and the common mode voltage, and
during a second period of time that follows the first period of time and does not overlap the first period of time:
the fourth sampling circuit charges the fourth capacitor with a fifth voltage generated between a first reference voltage and the common mode voltage,
the first sampling circuit charges the first capacitor with a sixth voltage generated between a second reference voltage and the common mode voltage,
the second sampling circuit provides a first charge, stored in the second capacitor during the first period of time, to the first differential input terminal of the differential amplifier and provides the first reference voltage to the second capacitor, so as to maintain the first charge within the second capacitor, and
the third sampling circuit provides a second charge, stored in the third capacitor during the first period of time, to the second differential input terminal of the differential amplifier and provides the second reference voltage to the third capacitor, so as to maintain the second charge within the third capacitor.

12. The switched capacitor circuit of claim 11, wherein:
the first sampling circuit further comprises:
a first switch that provides the first differential input signal to the first capacitor during the first period of time and precludes the first capacitor from receiving the first differential input signal during the second period of time, and
a second switch that provides the second reference voltage to the first capacitor during the second period of time and precludes the first capacitor from receiving the second reference voltage during the first period of time, and
the fourth sampling circuit further comprises:
a third switch that provides the second differential input signal to the fourth capacitor during the first period of time and precludes the fourth capacitor from receiving the second differential input signal during the second period of time, and
a fourth switch that provides the first reference voltage to the fourth capacitor during the second period of time and precludes the fourth capacitor from receiving the first reference voltage during the first period of time.

13. The switched capacitor circuit of claim 12, wherein:
the second sampling circuit further comprises:
a fifth switch that provides the first differential input signal to the second capacitor during the first period of time and precludes the second capacitor from receiving the first differential input signal during the second period of time, and
a sixth switch that provides the first reference voltage to the second capacitor during the second period of time and precludes the second capacitor from receiving the first reference voltage during the first period of time, and the third sampling circuit further comprises:
- a seventh switch that provides the second differential input signal to the third capacitor during the first period of time and precludes the third capacitor from receiving the second differential input signal during the second period of time, and
- an eighth switch that provides the second reference voltage to the third capacitor during the second period of time and precludes the third capacitor from receiving the second reference voltage during the first period of time.

14. The switched capacitor circuit of claim 13, further comprising a ninth switch that provides the common mode voltage to each of the second and third capacitors during the first period of time and precludes the second and third capacitors from receiving the common mode voltage during the second period of time.

15. The switched capacitor circuit of claim 11, further comprising:
- a first charge supply circuit that:
  - charges a fifth capacitor with a third reference voltage during the first period of time, and
  - generates, during the second period of time, the first reference voltage from a charge stored in the fifth capacitor during the first period of time, and a second charge supply circuit that:
- charges a sixth capacitor with a fourth reference voltage during the first period of time, and
- generates, during the second period of time, the second reference voltage from a charge stored in the sixth capacitor during the first period of time.

16. The switched capacitor circuit of claim 15, wherein:
the fifth capacitor generates the first reference voltage from the charge stored in the fifth capacitor during a first portion of the second period of time,
a fifth reference voltage generates the first reference voltage during a second portion of the second period of time,
the sixth capacitor generates the second reference voltage from the charge stored in the sixth capacitor during the first portion of the second period of time, and
a sixth reference voltage generates the second reference voltage during the second portion of the second period of time.

17. The switched capacitor circuit of claim 16, wherein the second portion of the second period of time follows the first portion of the second period of time and does not overlap the first portion of the second period of time.

* * * * *